US012693011B2

(12) United States Patent
Khan et al.

(10) Patent No.: US 12,693,011 B2
(45) Date of Patent: Jul. 28, 2026

(54) FLARING OPTIMIZATION RESPONSIVE TO WIND CONDITIONS

(71) Applicant: Schlumberger Technology Corporation, Sugar Land, TX (US)

(72) Inventors: Fareez Zameer Khan, Clamart (FR); Hugues Trifol, Clamart (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 311 days.

(21) Appl. No.: 18/588,080

(22) Filed: Feb. 27, 2024

(65) Prior Publication Data

US 2024/0288166 A1     Aug. 29, 2024

Related U.S. Application Data

(60) Provisional application No. 63/487,034, filed on Feb. 27, 2023.

(51) Int. Cl.
| | |
|---|---|
| *F23N 5/24* | (2006.01) |
| *E21B 41/00* | (2006.01) |
| *F23G 7/08* | (2006.01) |
| *F23K 5/00* | (2006.01) |
| *G06F 30/28* | (2020.01) |

(52) U.S. Cl.
CPC .......... *F23N 5/242* (2013.01); *E21B 41/0071* (2013.01); *F23G 7/08* (2013.01); *F23K 5/007* (2013.01); *G06F 30/28* (2020.01); *F23K 2400/10* (2020.05); *F23K 2400/201* (2020.05)

(58) Field of Classification Search
CPC ........ F23N 5/242; E21B 41/0071; F23G 7/08;
F23G 5/50; F23G 2207/00; F23G
2209/14; F23K 5/007; F23K 2400/10;
F23K 2400/201; G06F 30/28; G05D
7/0635

See application file for complete search history.

(56) References Cited

FOREIGN PATENT DOCUMENTS

| | | | | |
|---|---|---|---|---|
| CA | 3143341 A1 * | 12/2020 | .......... | G07C 5/0816 |
| GB | 1547723 A | 6/1979 | | |
| KR | 20160034466 A | 3/2016 | | |
| KR | 20180108117 A | 10/2018 | | |
| KR | 20230141098 A | 10/2023 | | |
| WO | 2012085503 A2 | 6/2012 | | |
| WO | WO-2021141749 A1 * | 7/2021 | ............ | F23N 5/082 |
| WO | 2024137906 A1 | 6/2024 | | |

OTHER PUBLICATIONS

Elvidge, C. D. et al., "Methods for Global Survey of Natural Gas Flaring from Visible Infrared Imaging Radiometer Suite Data", Energies 2016, 9(1):14, 15 Pages.

Iea, "Methane Tracker 2020" Fuel Report, downloaded from the internet on Dec. 16, 2024 from {https://www.iea.org/reports/methane-tracker-2020}, Mar. 2020, 9 Pages.

Combined Search and Examination Report issued in GB Patent Application No. 2402779.9, dated Jul. 24, 2024, 7 pages.

* cited by examiner

*Primary Examiner* — Charles R Kasenge

(74) *Attorney, Agent, or Firm* — Kyle R. Miiller

(57)     ABSTRACT

A method can include receiving wind conditions data; determining a control action to control a flaring operation at a site using the wind conditions data; and issuing the control action to control the flaring operation.

15 Claims, 11 Drawing Sheets

VIIRS – Algeria Calibration Point

VIIRS and Sentinel 5P Correlation

600

Fraction of
So2 (ppm)

00  20  40  60  80  100 120 140 160 180 200

Framework 900

Method 1000

FLARING OPTIMIZATION RESPONSIVE TO WIND CONDITIONS

BACKGROUND

The global oil and gas industry is trending toward improved environmental safety and compliance throughout the various phases of a well lifecycle. Exploration and production involve dynamic well testing that can produce large amounts of hydrocarbons at the surface. As, at times, excess hydrocarbons cannot be stored, they may be disposed of by flaring, which can be relevant for onshore operations and offshore operations. Flaring can occur during various phases or operations, which can include drilling, well testing, production, etc.

Combustion of hydrocarbon can result various types of emissions, which can include, for example, visible emission, heat energy emission, and smoke. Burner operations (e.g., flaring) can be controlled on site, for example, via air supply adjustment, which may aim to maintain acceptable combustion through variations in fluid properties, flowrates, and weather conditions.

For the continuous burning phase which can last for days, on site monitoring and regulation of air supply to the burner can be controllable if appropriate control equipment to regulate gas flow and combustion exists on site. A failing to monitor combustion and adjust air supply according to the flame or smoke appearance can have a negative impact on the combustion quality and emissions from the burner. For example, consider short chain hydrocarbons such as methane, propane, ethylene, propylene, butadiene and butane, which under ideal conditions can react efficiently with atmospheric oxygen to form carbon dioxide ($CO_2$) and water. Inefficient combustion (i.e., poor quality combustion) can result in higher emissions of such hydrocarbons along with chemical intermediates. Inefficient combustion can result in environmental and regulatory issues. Flare monitoring can increase awareness of inefficient combustion of lit flares and may provide indications of direct emissions from unlit flares.

In various situations, even with relatively efficient combustion, environmental conditions may be insufficient to assure that combustion constituents clear a wellsite. For example, consider a no wind situation where combustion constituents may build up within the atmosphere at a wellsite. In such a situation, flaring may be halted or otherwise prohibited, which can impact wellsite operations. For example, well testing may be halted, delayed, etc., until environmental conditions exist that are sufficient to disperse combustion constituents. In such an example, such environmental conditions may not exist for a matter of days, weeks or even a month or more, which can greatly impact schedules and operations.

SUMMARY

A method can include receiving wind conditions data; determining a control action to control a flaring operation at a site using the wind conditions data; and issuing the control action to control the flaring operation.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description is not to be taken in a limiting sense, but rather is made merely for the purpose of describing the general principles of the implementations. The scope of the described implementations should be ascertained with reference to the issued claims.

Methane ($CH4$) is a hydrocarbon that can be classified as an anthropogenic greenhouse gas (GHG) in the atmosphere (e.g., consider carbon dioxide as another type of greenhouse gas). The International Energy Agency (IEA) Methane Tracker 2020 report states that emissions from the oil and gas industry account for approximately 22 percent of anthropogenic sources (see IEA Methane Tracker, Fuel report—March 2020 https://www.iea.org/reports/methane-tracker-2020).

When natural gas is burned in a flare, $CO_2$ and water are generated as products of the combustion process. Considering that methane is estimated to be 80 times more potent that $CO_2$ in a 20-year lifespan, knowing the status of a flare (e.g., a burner) can be helpful. Further, if natural gas includes $H2S$ (hydrogen sulfide), its combustion products (e.g., combustion constituents) can include $SO2$, which is toxic at certain levels. If $SO2$ is generated and does not disperse, risks can increase at a site to humans, equipment and the site environment. While $SO2$ is mentioned, constituents may include nitrogen that can be combusted to form NOx, which too may be detrimental if not properly dispersed.

In various instances, an operation that involves flaring may be most vulnerable to environmental conditions during a start-up period (e.g., start-up phase) where fluid flow may be relatively low such that gas velocity does not substantially aid in dispersal of combustion constituents. In such instances, a control system may be implemented that can aid in increasing gas velocity and, for example, controlling one or more other flaring parameters (e.g., orientation of a boom, etc.). As an example, a control system may call for separation of liquid from gas to increase gas velocity, flow of fluid to a smaller diameter conduit to increase gas velocity, etc. In such an example, the control system can sense levels of one or more chemicals at one or more locations, which may indicate whether flaring can proceed and/or whether one or more other control actions can be taken to improve flaring performance. As an example, a transition from a start-up period to a higher flow rate period may occur whereby a controller can change a control strategy responsive to such a transition. As an example, a control system can provide for starting up an operation that involves flaring under environmental conditions that may otherwise be, conventionally, unsuitable.

Figure 1:
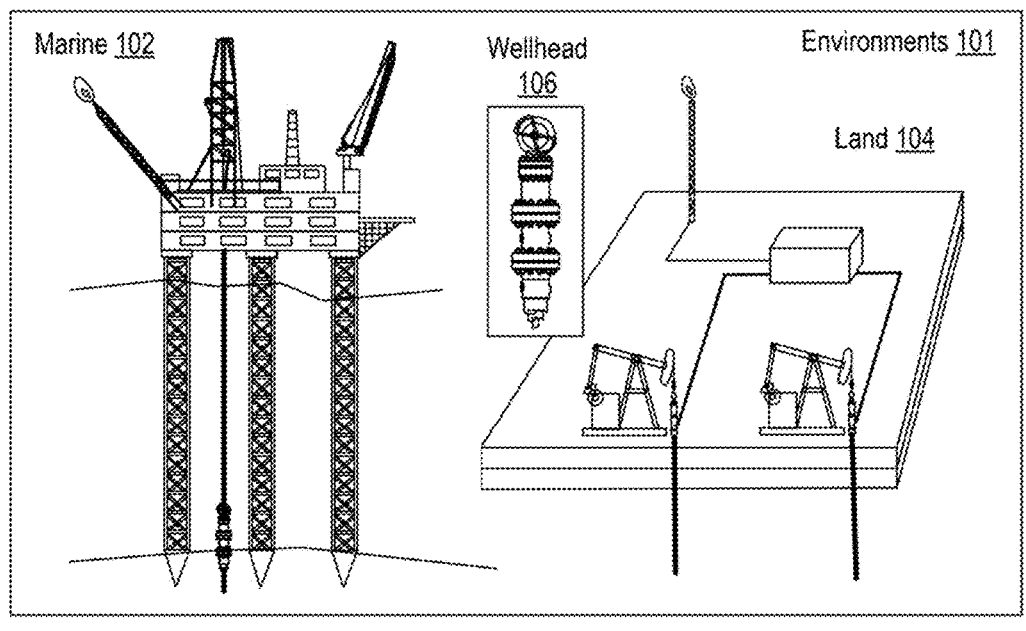
FIG. 1 is a series of diagrams of example environments and an example of a burner system.
Figure 1:
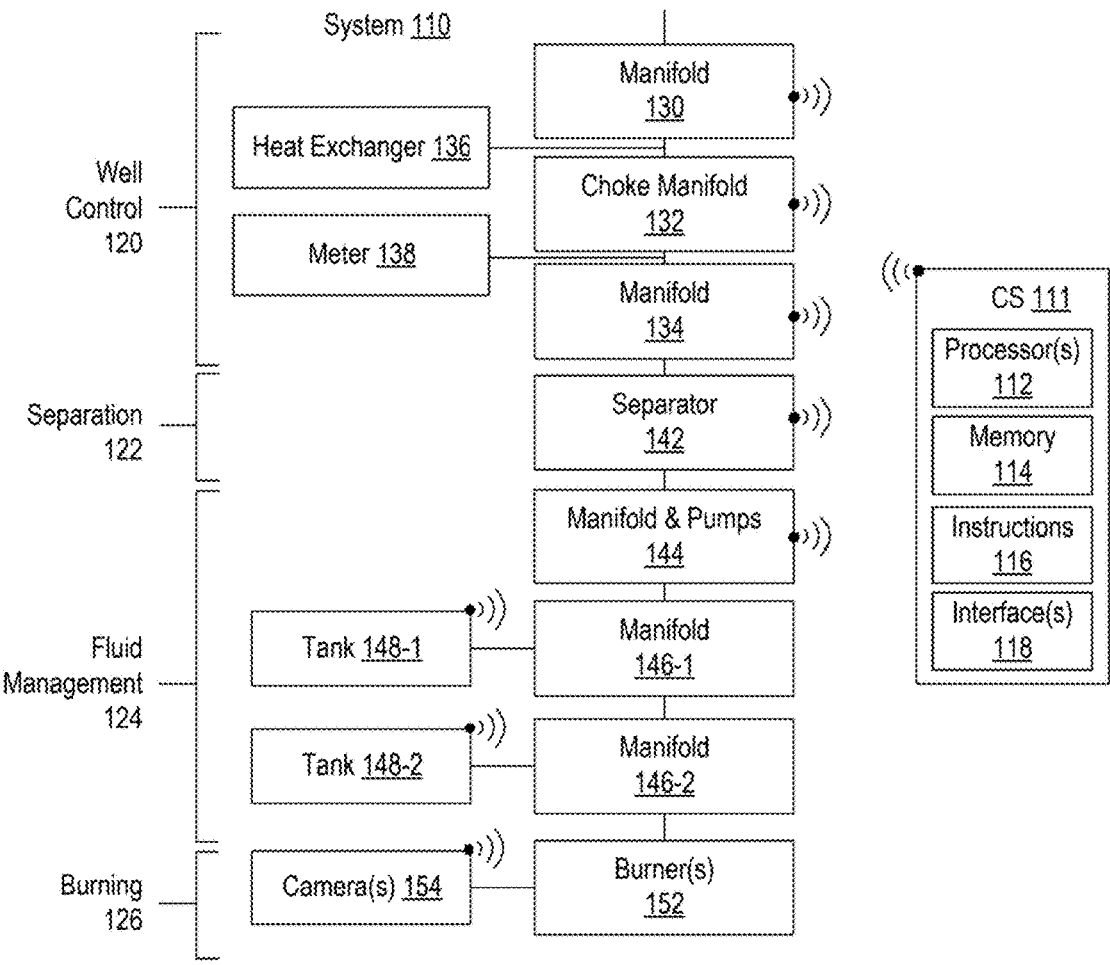

FIG. 1 shows examples of environments 101, including a marine environment 102 and a land environment 104 where the marine environment 102 includes various equipment and where the land environment 104 includes various equipment. As shown, each of the environments 101 can include one or more wellheads 106 (e.g., wellhead equipment). A wellhead can be a surface termination of a wellbore that can include a system of spools, valves and assorted adapters that, for example, can provide for pressure control of a production well. A wellhead may be at a land surface, a subsea surface (e.g., an ocean bottom, etc.), etc. As an example, conduits from multiple wellheads may be joined at one or more manifolds such that fluid from multiple wells can flow in a common conduit.

At various times, a well may be tested using a process referred to as well testing. During well testing, reservoir fluids can be produced at a separator at varying rates, for example, according to a predetermined schedule. Such tests may take less than two days to evaluate a single well or may take months to evaluate reservoir extent. As such, flaring, which may depend on test type, etc., may occur over a period of a day or less or more than a month. Well testing can include one or more of a variety of well testing operations where tests may include, for example, one or more of buildup, drawdown, falloff, injection and interference. In various instances, fluid can flow from a well or wells to surface where the fluid is subjected to one or more well testing operations and generates scrap (e.g., waste fluid), which must be handled appropriately, for example, according to circumstances, regulations, etc. For example, consider loading waste fluid into a tanker for transport to a facility that can dispose of the waste fluid. Another manner of handling waste fluid can be through combustion, which can be referred to as burning. As an example, burning can be part of a well testing process, whether burning is for handling waste fluid and/or for analyzing one or more aspects of how one or more waste fluids burn. As to the latter, burning may optionally provide data as to one or more characteristics of well fluid (e.g., a component thereof, etc.).

As an example, disposal of produced hydrocarbons during one or more types of operations may be via burning, which can include on-site burning and/or off-site burning. Burning can be particularly suitable when facilities are not available for storage (e.g., consider mobile offshore drilling rigs, remote locations onshore, etc.).

As to the example environments 101 of FIG. 1, consider well testing as an operation that may be performed, for example, using equipment shown in the marine environment 102 and/or using equipment shown in the land environment 104. As an example, an environment may be under exploration, development, appraisal, etc., where such an environment includes at least one well where well fluid can be produced (e.g., via natural pressure, via fracturing, via artificial lift, via pumping, via flooding, etc.). In such an environment, various types of equipment may be on-site, which may be operatively coupled to well testing equipment.

FIG. 1 shows an example of a system 110 that can be operatively coupled to one or more conduits that can transport well fluid, for example, from one or more wellheads. As shown, the system 110 can include a computational system 111 (CS), which can include one or more processors 112, a memory 114 accessible to at least one of the one or more processors 112, instructions 116 that can be stored in the memory 114 and executable by at least one of the one or more processors 112, and one or more interfaces 118 (e.g., wired, wireless, etc.). In the example of FIG. 1, the system 110 is shown as including various communication symbols, which may be for transmission and/or reception of information (e.g., data, commands, etc.), for example, to and/or from the computational system 111. As an example, the computational system 111 can be a controller that can issue control instructions to one or more pieces of equipment in an environment such as, for example, the marine environment 102 and/or the land environment 104. As an example, the computational system 111 may be local, may be remote or may be distributed such that it is in part local and in part remote.

Referring again to the wellhead 106, it can include various types of wellhead equipment such as, for example, casing and tubing heads, a production tree, a blowout preventer, etc. Fluid produced from a well can be routed through the wellhead 106 and into the system 110, which can be configured with various features for well testing operations.

In the example of FIG. 1, the system 110 is shown to include various segments, which may be categorized operationally. For example, consider a well control segment 120, a separation segment 122, a fluid management segment 124, and a burning segment 126.

As shown in the example of FIG. 1, the well control segment 120 is an assembly of various components such as a manifold 130, a choke manifold 132, a manifold 134, a heat exchanger 136 and a meter 138; the separation segment 122 includes a separator 142; the fluid management segment 124 is an assembly of various components such as manifolds and pumps 144, a manifold 146-1, a manifold 146-2, a tank 148-1 and a tank 148-2; and the burning segment 126 includes a burner 152 and one or more cameras 154.

As mentioned, in the example of FIG. 1, the system 110 includes various features for one or more aspects of well testing operations; noting that the system 110 may include lesser features, more features, alternative features, etc. For example, consider one or more of a gas specific gravity meter, a water-cut meter, a gas-to-oil ratio sensor, a carbon dioxide sensor, a hydrogen sulfide sensor, or a shrinkage measurement device. Various features may be upstream and/or downstream of a separator segment or a separator.

With respect to flow of fluid from a well or wells, such fluid may be received by the well control segment 120 and then routed via one or more conduits to the separation segment 122. In the example of FIG. 1, the well control segment 120, the heat exchanger 136 may be provided as a steam-heat exchanger and the meter 138 for measuring flow of fluid through the well control segment 120.

As mentioned, the well control segment 120 can convey fluid received from one or more wells to the separator 142. As an example, the separator 142 can be a horizontal separator or a vertical separator, and can be a two-phase separator (e.g., for separating gas and liquids) or a three-phase separator (e.g., for separating gas, oil, and water). A separator may include various features for facilitating separation of components of incoming fluid (e.g., diffusers, mist extractors, vanes, baffles, precipitators, etc.).

As an example, fluid can be single phase or multiphase fluid where "phase" refers to an immiscible component (e.g., consider two or more of oil, water, and gas).

As an example, the separator 142 can be used to substantially separate multiphase fluid into its oil, gas, and water phases, as appropriate and as present, where each phase emerging from the separator 142 may be referred to as a separated fluid. Such separated fluids may be routed away from the separator 142 to the fluid management segment 124. In various instances, the separated fluids may not be entirely homogenous. For example, separated gas exiting the separator 142 can include some residual amount of water or oil and separated water exiting the separator 142 can include some amount of oil or entrained gas. Similarly, separated oil leaving the separator 142 can include some amount of water or entrained gas.

As shown in the example of FIG. 1, the fluid management segment 124 includes flow control equipment, such as various manifolds and pumps (generally represented by the block 144) for receiving fluids from the separator 142 and conveying the fluids to other destinations, as well as additional manifolds 146-1 and 146-2 for routing fluid to and from fluid tanks 148-1 and 148-2. While two manifolds 146-1 and 146-2 and two tanks 148-1 and 148-2 are depicted in FIG. 1, it is noted that the number of manifolds and tanks can be varied. For instance, in one embodiment, the fluid management segment 124 can include a single manifold and a single tank, while in other embodiments, the fluid management segment 124 can include more than two manifolds and more than two tanks.

As to the manifolds and pumps 144, they can include a variety of manifolds and pumps, such as a gas manifold, an oil manifold, an oil transfer pump, a water manifold, and a water transfer pump. In at least some embodiments, the manifolds and pumps 144 can be used to route fluids received from the separator 142 to one or more of the fluid tanks 148-1 and 148-2 via one or more of the additional manifolds 146-1 and 146-2, and to route fluids between the tanks 148-1 and 148-2. As an example, the manifolds and pumps 144 can include features for routing fluids received from the separator 142 directly to the one or more burners 152 for burning gas and oil (e.g., bypassing the tanks 148-1 and 148-2) or for routing fluids from one or more of the tanks 148-1 and 148-2 to the one or more burners 152.

As noted above, components of the system 110 may vary between different applications (e.g., operations, etc.). As an example, equipment within each functional group of the system 110 may also vary. For example, the heat exchanger 136 could be provided as part of the separation segment 122, rather than of the well control segment 120.

In certain embodiments, the system 110 can be a surface well testing system that can be monitored and controlled remotely. Remote monitoring may be effectuated with sensors installed on various components. In some instances, a monitoring system (e.g., sensors, communication systems, and human-machine interfaces) can enable monitoring of one or more of the segments 120, 122, 124, and 126. As shown in the example of FIG. 1, the one or more cameras 154 can be used to monitor one or more burning operations of the one or more burners 152, which may aim to facilitate control of such one or more burning operations at least in part through analysis of image data acquired by at least one of the one or more cameras 154.

Figure 2:
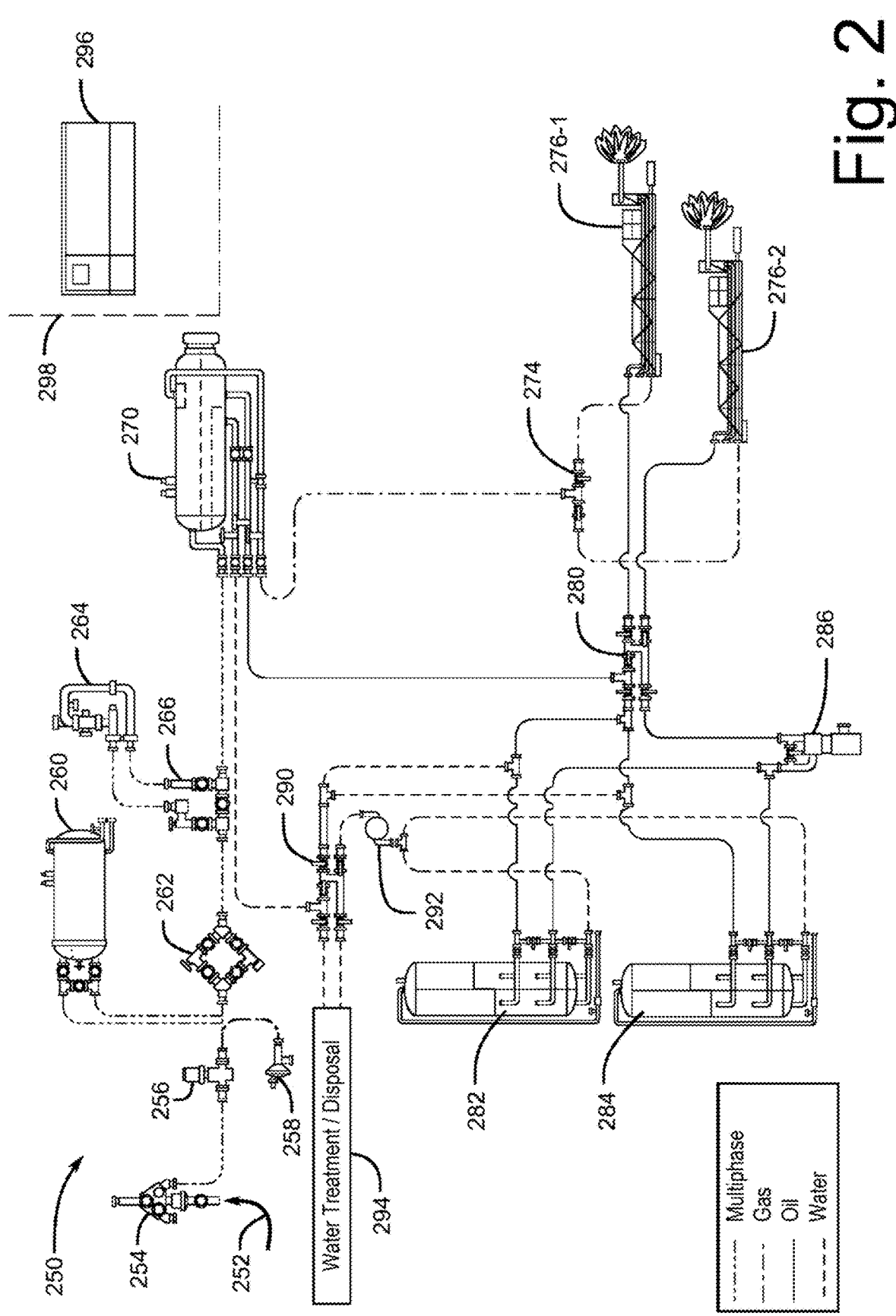
FIG. 2 is a diagram of an example of a burner system.

FIG. 2 shows an example of a system 250, which may be referred to as a surface well testing system. The system 250 can include various features of the system 110 of FIG. 1. Various equipment of the system 250, such as flaring equipment, may be present at one or more types of sites (e.g., production sites, well testing sites, etc.).

In FIG. 2, a multiphase fluid (represented here by arrow 252) enters a flowhead 254 and is routed to a separator 270 through a surface safety valve 256, a steam-heat exchanger 260, a choke manifold 262, a flow meter 264, and an additional manifold 266. In the example of FIG. 2, the system 250 includes a chemical injection pump 258 for injecting chemicals into the multiphase fluid flowing toward the separator 270.

In the depicted embodiment of FIG. 2, the separator 270 is a three-phase separator that generally separates the multiphase fluid 252 into gas, oil, and water components. The separated gas is routed downstream from the separator 270 through a gas manifold 274 to either of the burners 276-1 and 276-2 for flaring gas and burning oil. The gas manifold 274 includes valves that can be actuated to control flow of gas from the gas manifold 274 to one or the other of the burners 276-1 and 276-2. Although shown next to one another in FIG. 2 for sake of clarity, the burners 276-1 and 276-2 may be positioned apart from one another, such as on opposite sides of a rig, etc.

As shown, the separated oil from the separator 270 can be routed downstream to an oil manifold 280. Valves of the oil manifold 280 can be operated to permit flow of the oil to either of the burners 276-1 and 276-2 or either of the tanks 282 and 284. The tanks 282 and 284 can be of a suitable form, but are depicted in FIG. 2 as vertical surge tanks each having two fluid compartments. This allows each tank to simultaneously hold different fluids, such as water in one compartment and oil in the other compartment. An oil transfer pump 286 may be operated to pump oil through the well testing system 250 downstream of the separator 270. The separated water from the separator 270 can be similarly routed to a water manifold 290. Like the oil manifold 280, the water manifold 290 includes valves that can be opened or closed to permit water to flow to either of the tanks 282 and 284 or to a water treatment and disposal apparatus 294. A water transfer pump 292 may be used to pump the water through the system.

A well test area in which the well testing system 250 (or other embodiments of a well testing system) is installed may be classified as a hazardous area. In some embodiments, the well test area is classified as a Zone 1 hazardous area according to International Electrotechnical Commission (IEC) standard 60079-10-1:2015.

In the example of FIG. 2, a cabin 296 at a wellsite may include various types of equipment to acquire data from the well testing system 250. These acquired data may be used to monitor and control the well testing system 250. In at least some instances, the cabin 296 can be set apart from the well test area having the well testing system 250 in a non-hazardous area. This is represented by the dashed line 298 in FIG. 2, which generally serves as a demarcation between the hazardous area having the well testing system 250 and the non-hazardous area of the cabin 296.

The equipment of a system can be monitored during a process to verify proper operation and facilitate control of the process. Such monitoring can include taking numerous measurements, examples of which can include choke manifold temperature and pressures (upstream and downstream), heat exchanger temperature and pressure, separator temperature and pressures (static and differential), oil flow rate and volume from the separator, water flow rate and volume from the separator, and fluid levels in tanks of a system.

As an example, a mobile monitoring system may be provided. In such an example, monitoring of a process can be performed on a mobile device (e.g., a mobile device suitable for use in Zone 1 hazardous area, like the well test area). Various types of information may be automatically acquired by sensors and then presented to an operator via the mobile device. The mobile monitoring system may provide various functions, such as a sensor data display, video display, sensor or video information interpretation for quality-assurance and quality-control purposes, and a manual entry screen (e.g., for a digital tally book for recording measurements taken by the operator).

As an example, a site can include one or more computing devices. For example, consider a programmable logic controller (PLC), a gateway device, etc. As to a gateway device or simply gateway, it can include one or more features of an AGORA gateway (e.g., v.202, v.402, etc.) and/or another gateway. For example, consider an INTEL ATOM E3930 or E3950 Dual Core with DRAM and an eMMC and/or SSD. Such a gateway may include a trusted platform module (TPM), which can provide for secure and measured boot support (e.g., via hashes, etc.). A gateway may include one or more interfaces (e.g., Ethernet, RS485/422, RS232, etc.). As to power, a gateway may consume less than about 100 W (e.g., consider less than 10 W or less than 20 W). As an example, a gateway may include an operating system (e.g., consider LINUX DEBIAN LTS). As an example, a gateway may include a cellular interface (e.g., 4G LTE with Global Modem/GPS, etc.). As an example, a gateway may include a WIFI interface (e.g., 802.11 a/b/g/n). As an example, a gateway may be operable using AC 100-240 V, 50/60 Hz or 24 VDC. As to dimensions, consider a gateway that has a protective box with dimensions of approximately 10 in×8 in×4 in (e.g., 25 cm×20.3 cm×10.1 cm). A gateway may be operatively coupled to various pieces of equipment at a site and operatively coupled to one or more networks, which may include cloud resources (e.g., cloud platform resources). As an example, a gateway may be an edge-type of device that can be controlled, accessed, etc., remotely.

Figure 3:
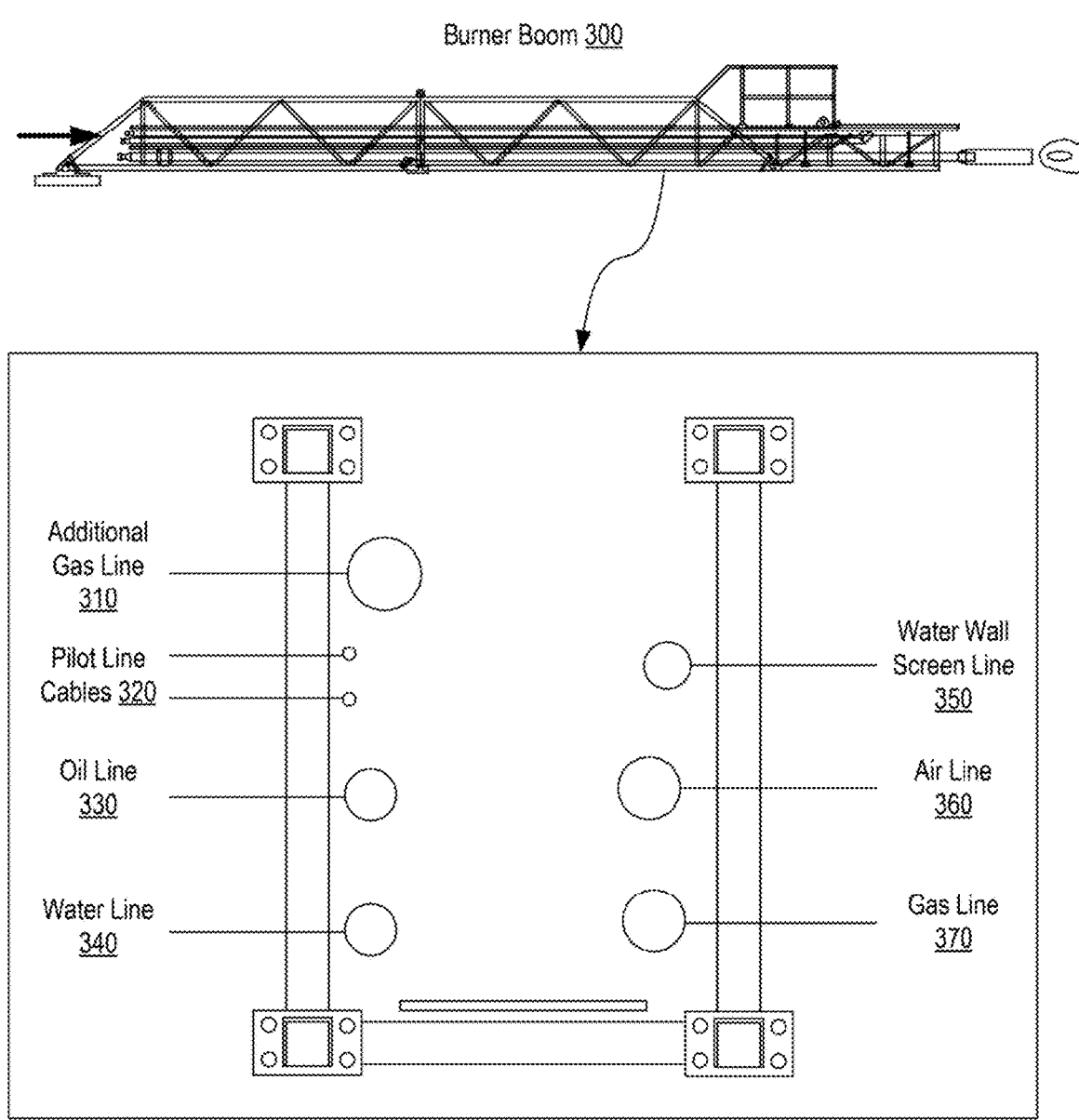
FIG. 3 is a diagram of an example of a burner boom.

FIG. 3 shows an example of a burner boom 300, which can be configured for horizontal mounting, mounting at an angle, vertical mounting, etc. For example, the burner boom 300 can be mounted on a rig with a rotating base plate and guy lines. In such an example, horizontal guy lines can help to orient the burner boom 300; vertical guy lines, which are fixed to the rig's main structure, can support the burner boom 300. A rotating base can enable horizontal and vertical positioning of the burner boom 300 and its burner. As an example, the burner boom 300 may be positioned slightly above horizontal so that oil left in piping after flaring operations does not leak out. Flaring equipment such as the burner boom 300 may be present at one or more types of sites (e.g., production sites, well testing sites, etc.) to provide for flaring operations.

As an example, a burner can be boom mounted or mounted on another type of support structure. As an example, a structure can support various conduits that provide fluid such as, for example, one or more of air, water, oil, and propane.

In the example of FIG. 3, conduits or lines include an additional gas line 310, pilot line cables 320, an oil line 330, a water line 340, a water wall screen line 350, an air line 360, and a main gas line 370.

As to the burner boom 300 of FIG. 3, its burner can be configured and controlled to perform in a desirable manner. For example, it may be desired to burn in a fallout-free and smokeless manner for combustion of liquid hydrocarbons produced during well testing. As an example, a burner geometry can utilize pneumatic atomization and enhanced air induction. As an example, a burner can be equipped with one or more pilots, a flame-front ignition system (BRFI), and a built-in water screen to reduce heat radiation. As an example, a burner can be fitted with an automatic shutoff valve that prevents oil spillage at the beginning and end of a burning run.

As to burner control, a burner can include a high turndown feature (e.g., 1:5), which may be optionally further extended to a higher ratio (e.g., 1:30) using a multirate kit (BMRK) option, which allows for selecting the number of operating nozzles. For onshore operations, a skid may be utilized for skid-mounting.

As to burner efficiency, a burner may be suited for high efficiency burning with one or more types of oil (e.g., including particularly heavy and waxy oils). As an example, a burner may operate effectively up to a water cut rating (e.g., up to 25 percent water cut), which may be desirable for various types of cleanup operations.

As a burner may be operational in a manner that provides for substantially no liquid fallout and substantially no visible smoke emissions, such a burner may be particularly suited for operations in environmentally sensitive areas.

Figure 4:
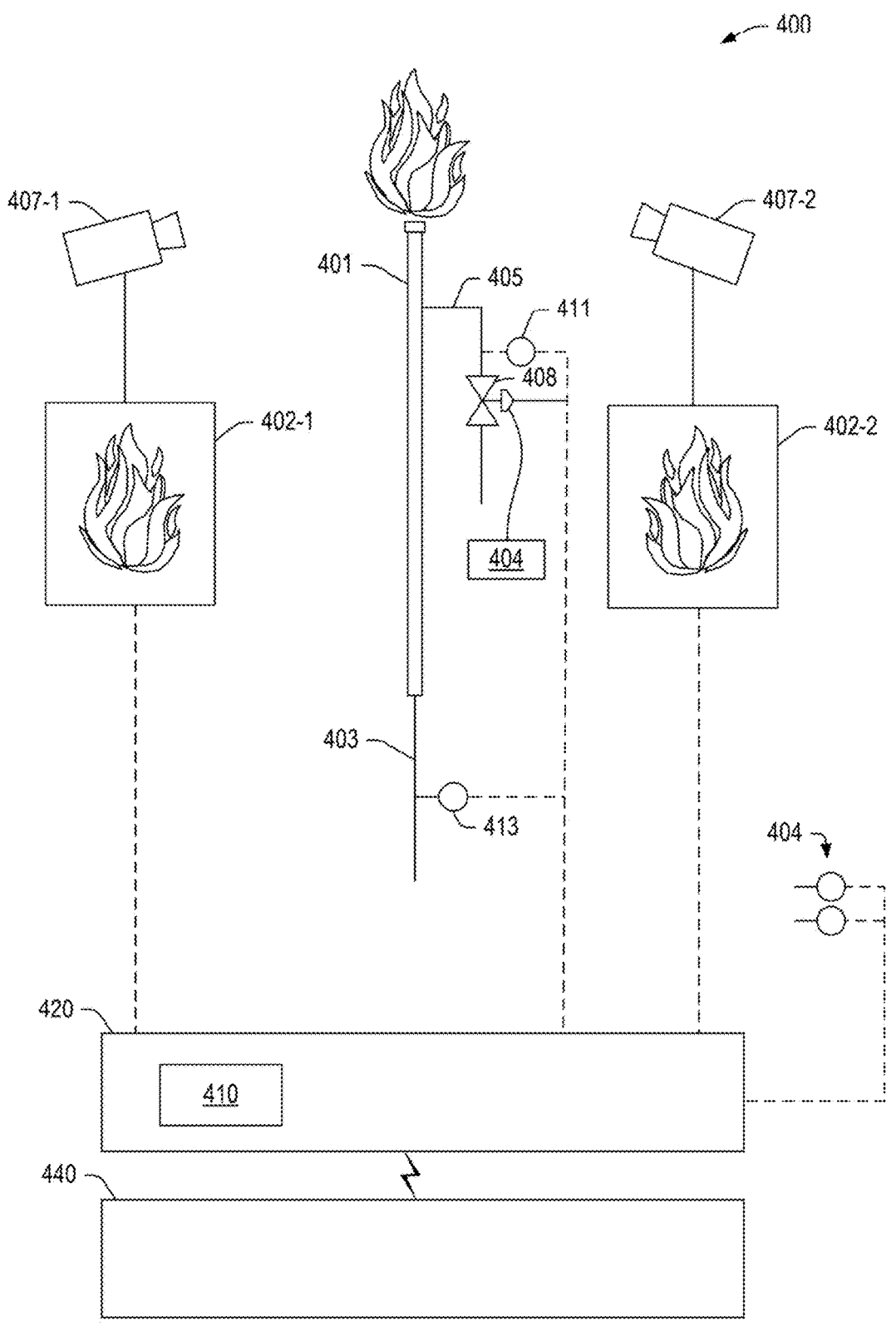
FIG. 4 is a diagram of an example of a burner system.

FIG. 4 is a system diagram of an example of a burner control system 400. The system 400 includes at least one camera 407-1 and 407-2 positioned to capture one or more images 402-1 and 402-2 of a flare emitted by a burner 401. In the example of FIG. 4, two cameras 407-1 and 407-2 are shown capturing images 402-1 and 402-2 from different locations to acquire image data from more than one image plane of the flare. The burner 401 includes a fuel feed 403 that flows fuel to the burner 401 (see, e.g., the burners 276-1 and 276-2 of FIG. 2, the burner 300 of FIG. 3, etc.). The burner 401 also includes an air feed 405 that flows air to the burner 401. Flow rate of the air feed 405 is controlled by a control valve 408, where an air flow sensor 411 senses flow rate of air into the burner 401. A fuel flow sensor 413 senses flow rate of fuel to the burner 401. Other sensors 404, along with the at least one camera 407-1 and 407-2, are operatively coupled to local electronic equipment 420. The sensors 404 may sense, and produce signals representing, combustion effective parameters such as temperature, wind speed, and ambient humidity. The sensors 404, 411, and 413, and the cameras 407-1 and 407-2 send data, including data representing the images 402-1 and 402-2, along with data representing readings of the sensors 404, 411, and 413, directly and/or indirectly, to the local electronic equipment 420, which may be present at a wellsite in a production phase and/or a drilling phase (e.g., in a doghouse, a cabin, etc.). The data sent to the local electronic equipment 420 can represent a state of combustion taking place at the burner 401.

As shown in the example of FIG. 4, the local electronic equipment 420 can be in communication with remote electronic equipment 440. For example, consider use of one or more wired and/or wireless interfaces that allow for communications between the local and remote electronic equipment 420 and 440. In such an example, various computational tasks may be executed locally and/or remotely. For example, consider a local computing device that can include an application that can render a graphical user interface (GUI) to a display. In such an example, the GUI can include control graphics that are selectable to issue instructions such as, for example, one or more application programming interface (API) calls, which may be directed to the local electronic equipment 420, the remote electronic equipment 440, etc., to cause one or more actions to occur such as formulation of a response to an API call.

As an example, the local and remote electronic equipment 420 and 440 may be configured in a client-server arrangement where the local electronic equipment 420 operates as a client and the remote electronic equipment 440 operates as a server. As an example, data acquired by the local electronic equipment 420 (e.g., as part of the system 400) may be processed for local control and/or transmitted (e.g., as raw and/or processed data) for processing, storage, etc., by the remote electronic equipment 440. As an example, the remote electronic equipment 440 can include one or more cloud-based resources. In such an example, the remote electronic equipment 440 may provide services such as, for example, software as a service. As an example, control effectuated by the system 400 to control the burner 401 can be based on local and/or remote computing (e.g., using the local electronic equipment 420, the remote electronic equipment 440, etc.).

As to control of a burner, a model can be used, which may be a physics-based model, a machine learning model, a hybrid model, etc. As an example, a model-based approach can allow for prediction of various parameters such as, for example, air control parameters based on the data from the sensors 404, 411, and 413 and the at least one of the one or more cameras 407-1 and 407-2. As an example, one or more air control parameters can be applied to the control valve 408 to control air supply to the burner 401, which can be part of a combustion process that generates a flare that can be captured, as depicted in the one or more images 402-1 and 402-2.

Camera as used herein, means an imaging device. A camera can capture an image of electromagnetic (EM) radiation in a medium that can be converted to data for use in digital processing. The conversion can take place within the camera or in a separate processor. The camera may capture images in one wavelength or across a spectrum (e.g., or spectra), which may encompass the ultraviolet (UV) spectrum, the visible spectrum, and/or the infrared spectrum. For example, a camera may capture an image of wavelengths from approximately 350 nm to approximately 1,500 nm. As an example, one or more of a broad-spectrum imaging device such as a LIDAR detector, a narrower spectrum detector such as a charged-coupled device (CCD) array, and a short-wave infrared detector can be used as an imaging device or as imaging devices. Cameras can be monovision cameras or stereo cameras.

In the example of FIG. 4, the local electronic equipment 420 is shown as including an image processing unit 410, which may include and/or be operatively coupled to a model or models for purposes of processing one or more of the images 402-1 and 402-2 as captured by the at least one camera 407-1 and 407-2. As an example, a data set, along with sensor data representing oil flow rate, gas flow rate, water or steam flow rate, air flow rate, pressure, temperature, wind speed, ambient humidity, and other combustion effective parameters, can be considered different types of inputs. As an example, a model can receive input or inputs and can output one or more air control parameters, such as flow rate, pressure, and/or temperature, for the burner 401 (e.g., or burners) controlled by the system 400.

As to a machine learning model (ML model), such a model can be a neural network model (NN model). As an example, a trained ML model can be utilized to control one or more burners. As an example, a trained ML model can be trained with respect to a particular burner and/or type of burner. In such an approach, a trained ML model can be selected based at least in part on burner specifications (e.g., manufacturer, model, features, history, etc.).

Various types of data may be acquired and optionally stored, which may provide for training one or more ML models and/or for offline analysis, etc. For example, air control parameters output by a trained NN model can be stored in digital storage for later analysis, which may include further training, training a different ML model, etc. During control of an ongoing burning operation, one or more air control parameters can be transmitted to one or more control valves that control air supply to one or more burners as may be operatively coupled to the system controlled by the control system. Subsequent images and sensor data acquisitions can be captured, and the control cycle repeated as many times as desired. Frequency of repetition can depend on various time constants of the system 400. As an example, a cycle may be as short as a fraction of a second or as long as five to ten minutes. As an example, consider a 1 Hz operational frequency where several images are captured in a one second interval as in a video feed where computing air control parameters and applying the computed air control parameters to a control valve controlling air supply to the burner are based on the images in the one second interval. As an example, video may be live, with some amount of latency due to transmission and processing time, or video may be deliberately delayed by a delay amount.

As an example, the image processing unit 410 can convert signals derived from photons received by the one or more cameras 407-1 and 407-2 into data. The image processing unit 410 may be within or separate from a camera. As an example, the image processing unit 410 can convert signals received from the one or more cameras 407-1 and 407-2 into digital data representing photointensity in defined areas of the image and can assign position information to each digital data value. As an example, photointensity may be deconvolved into constituent wavelengths to produce a spectrum for each pixel. Such a spectrum may be sampled in defined bins, and the data from such sampling structured into a data set representing spectral intensity of the received image, for example, as a function of x-y position in the image. As an example, a timestamp can be added. For example, camera circuitry can include a digital clock and/or network circuitry that can receive a clock signal.

As an example, an image can be a pixel image with pixel position coordinate, a pixel depth and a timestamp. As to depth, various conventions may be utilized and depend on equipment and/or processing. Where color is utilized, a color depth can be referenced. For example, 8-bit color and 24-bit color can be the same where, in an RGB color space, 8-bits refers to each R, G, and B (e.g., subpixel), while 24-bit is a sum of the three 8-bit channels (e.g., 3×8=24). Standards can include, for example, monochrome (e.g., 1-bit) to 4K (e.g., 12-bit color, which provides 4096 colors), etc.

As an example, a method for assessing imagery can include accessing one or more resources as to color models (e.g., as a plug-in, external executable code, etc.). For example, consider a method that includes instructions to access an algorithm of a package, a computing environment, etc., such as, for example, the MATLAB computing environment (marketed by MathWorks, Inc., Natick, MA). The MATLAB computing environment includes an image processing toolbox, for example, with algorithms for color space (e.g., color model) conversions, transforms, etc. As an example, the MATLAB computing environment includes functions "rgb2hsv" and "hsv2rgb" to convert images between the RGB and HSV color spaces (see, e.g., http://www.mathworks.com/help/images/converting-color-data-between-color-spaces.html).

As an example, a model may be a simulated version of an environment, which may include one or more sites of possible emissions. As an example, a simulator may include features for simulating physical phenomena in an environment based at least in part on a model or models. A simulator, such as a weather simulator, can simulate fluid flow in an environment based at least in part on a model that can be generated via a framework that receives satellite data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model (e.g., of the Earth, the atmosphere, the oceans, etc.).

As an example, a system can monitor flares from space and detect when flares are unlit by fusing geospatial data from multiple sources and alerting when issues are detected. In such an example, an alert may be issued via a network interface to one or more destinations, which may include workstations, controllers, etc.

As to some examples of satellites, consider during nighttime, the Visible Infrared Imaging Radiometer Suite (VIIRS) sensor, which exists on the NOAA-20 satellite, which can be used for detecting and characterizing combustion sources. As another example, during daytime, the TROPOspheric Monitoring Instrument (TROPOMI) sensor, which is onboard on the Sentinel 5P Precursor satellite, from the European Space Agency (ESA) uses a short-wave infrared radiation sensor can measure methane concentrations on columns with a base area of 7×3.5 km². As yet another example, consider the Sentinel 3 satellite with the Sea and Land Surface Temperature Radiometer (SLSTR) instrument from the European Space Agency (ESA), which is also used to measure gas flares and give confidence to the VIIRS sensor. Yet another example is the Sentinel 2 satellite, which, as mentioned, has a resolution as fine as 20 m×20 m.

The VIIRS sensor provides for observation of gas flaring. At night, the VIIRS sensor records data in three near- to short-wave infrared channels (NIR and SWIR) designed for daytime imaging. With sunlight eliminated (e.g., night time), features detected in these three channels include combustion sources. The shortwave IR channel, at 1.61 µm, is at a wavelength at, or proximate to, peak radiant emissions from gas flares. The 4-µm channel, widely used in satellite fire detection, detects large flares due to the fact that it falls on the trailing edge of gas flare radiant emissions and observes a mixture of flare plus background radiant emissions. Generally, flare radiant emissions in the 4-µm channel are about a third of the emissions at 1.65 µm, which limits detection of smaller flares in standard satellite fire products based on channels set at the 4 µm wavelength. An article by Elvidge et al., Methods for Global Survey of Natural Gas Flaring from Visible Infrared Imaging Radiometer Suite Data, Energies 2016, 9, 14 (December 2015), is incorporated herein by reference in its entirety.

As an example, a method can include accessing satellite data as raw data and/or as processed data. For example, processed satellite data as to radiant heat and/or flow rate measurements can be received, which may be associated with flares (e.g., identified and/or not identified in the processed satellite data).

As an example, images from satellites, environmental data from weather stations, and high frequency satellite imagery can be fed to a system and processed to identify unlit flares.

Figure 5:
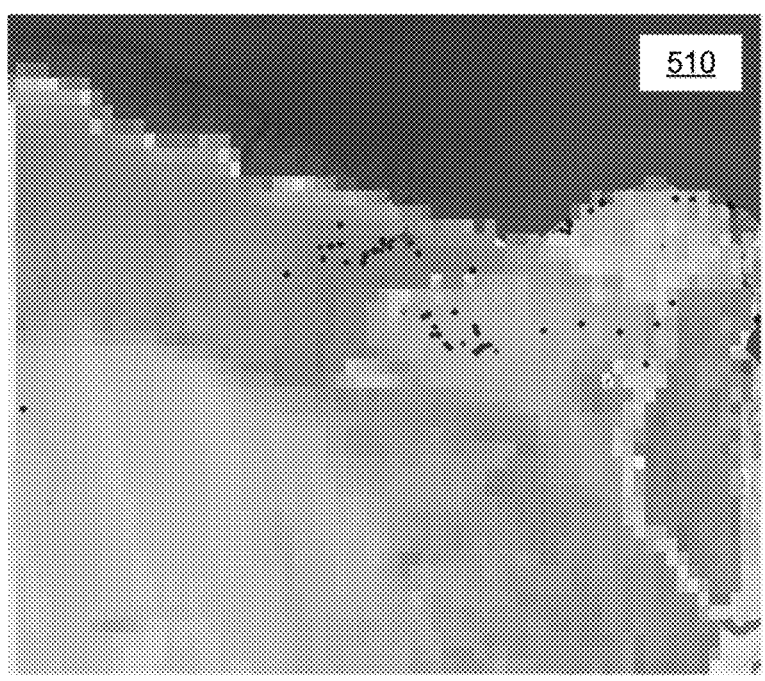
FIG. 5 is a series of example images and an example graphical user interface.
Figure 5:
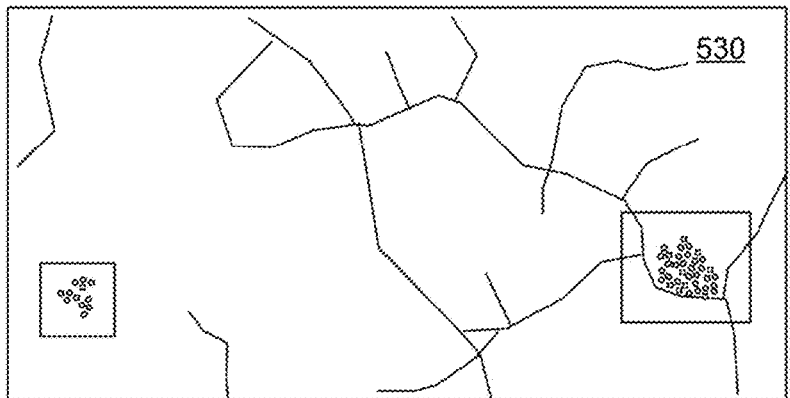
Figure 5:
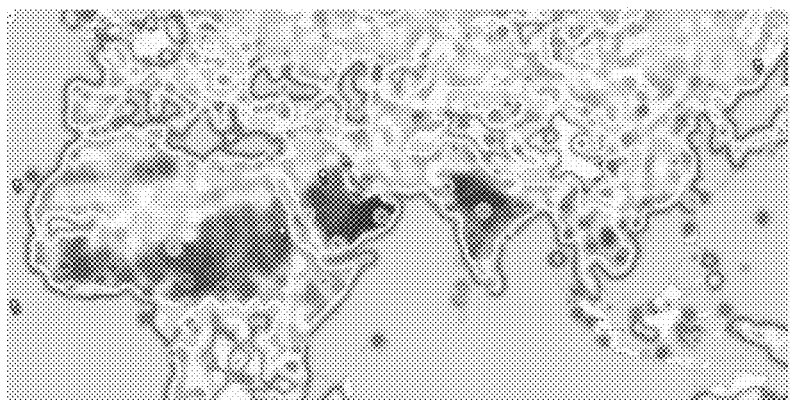

FIG. 5 shows example imagery 510 and imagery with a graphical user interface 530. The imagery 510 shows a combination of TROPOMI and flares from VIIRS satellite data for a region of Algeria. The imagery 510 shows a methane mixing ratio on the grid where the markers indicate detected flares. The flares are sized based on amount of radiant heat that is output. As to the imagery and GUI 530, it shows some testing related operations in Algeria based on an event where a flare had gone off where the lower portion is an alternative or additional way to render VIIRS and TROPOMI data. As explained, imagery can provide data as to one or more types of flares for one or more types of flaring operations (e.g., production, well testing, etc.).

High levels of gas flaring can present various types of issues for producers of hydrocarbons, which can include environmental issues, human safety issues, regulatory issues, etc. For example, consider gas exports under the European Union's carbon border adjustment mechanism (CBAM), which aims to introduce a tax on some products imported into the European Union (EU) based on carbon content, which may include crude oil or petroleum products. Such regulations may impact a region such as Algeria which, in 2020, exported 35 percent (approximately 364,000 b/d) of its total crude oil production to the EU. Data from the World Bank Group's Global Gas Flaring Reduction Partnership (GGFR) showed that Algeria flared some 9.3 bcm in 2020, making it the fifth-largest flarer in the world; noting that there was a slight reduction on the 9.34 bcm of 2019. Algeria's flare intensity, defined as gas flared per barrel of oil produced, was approximately 22.7 m³/bbl, which is the second-highest worldwide behind Venezuela, and higher than the global average of 5.1 m³/bbl. According to the GGFR, gas flaring satellite data from 2020 reveals that Russia, Iraq, Iran, the United States, Algeria, Venezuela and Nigeria remain the top seven gas flaring countries for nine years running, since the first satellite was launched in 2012. These seven countries produce 40 percent of the world's oil each year, but account for roughly two-thirds (65 percent) of global gas flaring.

Figure 6:
FIG. 6 is a diagram of an example of a system.
Figure 6:
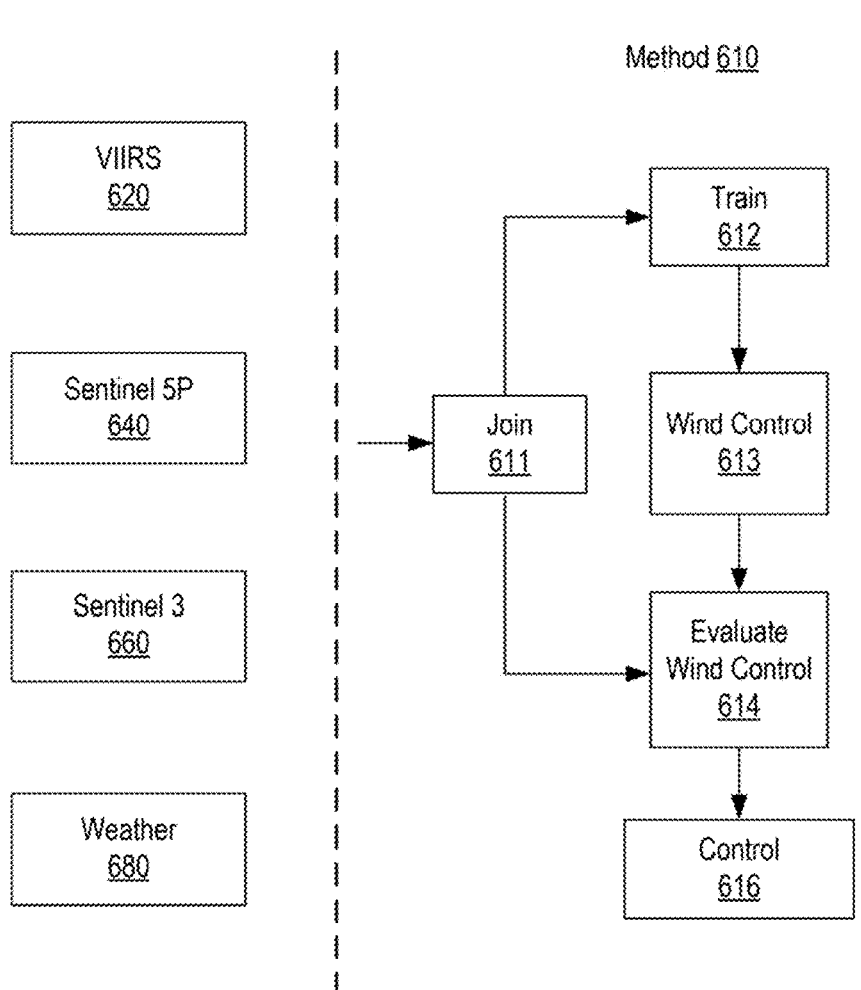

FIG. 6 shows an example of a workflow diagram of system 600. In the example of FIG. 6, various sources of data 620, 640, 660 and 680 are shown, for example, consider VIIRS source data, Sentinel 5P source data, Sentinel 3 source data and weather data, noting that one or more alternative and/or additional types of source data may be included. For example, consider one or more of local site data, local control data, solar wind data, etc. As shown in FIG. 6, various data can be fused using a method 610.

In the example of FIG. 6, the system 600 can include a weather data source or sources 680. In such an example, weather variables information (e.g., wind speed, direction, cloud cover, etc.) can be extracted. Such information can be utilized in a weather data spatial and/or temporal analysis, which may, for example, provide for aggregating weather data on a temporal basis and/or spatial basis.

As to the method 610, data may be joined per a join block 611 where such data, or a portion thereof, can be utilized to train one or more machine learning (ML) models per a train block 612, which may provide output as to wind control per a wind control block 613. For example, a trained ML model can predict how to control flaring for particular wind conditions, which can be for a particular location. As shown, the method 610 can evaluate a wind control output per an evaluation block 614. For example, consider using a digital twin (e.g., an avatar) of a flaring site where the digital twin can be subject to wind conditions and the wind control to determine if a result is favorable or unfavorable. In such an example, the method 610 may proceed to implement the wind control per a control block 616, for example, where the evaluation is favorable (e.g., or optionally neutral).

As an example, the system 600 can include features for evaluation of regional flare metrics, continuous and/or intermittent behaviors, flare presence or absence, etc.; can include features for evaluation of methane mixing ratio signals; can include features for evaluation of flare classification; and can include features for evaluation of weather variables.

As explained, there are a few public satellites that go around the Earth in polar orbits circling the Earth every 90 minutes. This means various public satellites can cover the whole surface of the earth approximately every 24 hours.

During night-time, the VIIRS sensor, which exists on the NOAA-20 satellite, can be used for detecting and characterizing combustion sources. During daytime, the TROPOMI sensor, which is onboard on the Sentinel 5P Precursor satellite, from the European Space Agency using a shortwave infrared radiation sensor can measure methane concentrations on columns with a base area of 7×3.5 km$^2$. The Sentinel 3 satellite with the Sea and Land Surface Temperature Radiometer (SLSTR) instrument from the European Space Agency may also be used to measure gas flares and give confidence to the VIIRS sensor.

There are also constellations of earth-imaging satellites that capture images with resolutions from 50 cm to a few meters that can also be used to monitor and confirm flare conditions.

If weather data are incorporated into a system, then various emission sources may be located using such weather data, for example, by analyzing plume sources, plume shapes and wind conditions (speed and direction). As an example, where satellite imagery (e.g., day time and/or night time) varies with respect to flyover times in terms of images and regions imaged (e.g., where a region or portion thereof may be in a different image frame over multiple flyover passes of a satellite), a method can include utilizing a trained machine learning model to identify sites in one or more images for a region imaged. In such an example, pattern-based identification (e.g., pattern recognition) may be utilized where lit flares can define a pattern, which may change over time due to wind conditions.

As an example, the system 600 can provide for flaring optimization in unfavorable wind conditions. Such a system may provide for control of flaring during testing operations, bleed off and flowback operations, one or more other onshore and/or offshore operations involving gas flaring, etc.

As explained, unfavorable wind conditions can be a basis for prohibition of flaring, for example, halting or otherwise delaying flaring. As various field operations can depend on an ability to flare, such operations may be halted or otherwise delayed. As an example, a framework can provide for control of flaring responsive to environmental conditions where, for example, flaring can be controlled such that flaring can occur under certain environmental conditions that would otherwise, conventionally, be deemed unsuitable.

As an example, a control action can provide for configuring gas flaring for onshore and/or offshore facilities with unfavorable wind conditions. As an example, a system can provide for performing process computations, computational fluid dynamics (CFD) and dispersion studies, monitoring and acquisition and automation.

As an example, a defined flare sizing and configuration can be determined and/or controlled that can be utilized onshore and/or offshore to optimize the dispersion of combustion gases and mitigate the associated risks. Where determinations can be made in real-time or near real-time, actions may be taken more rapidly, which may reduce detrimental aspects of non-optimal flaring. As an example, a system can reduce lost time and emissions when the wind conditions are unfavorable. Such a system can help to achieve proper dispersion of combustion gases.

As to control, a system can utilize multiple flare tip sizes at defined angles to achieve efficient dispersion of combustion gases under various wind conditions, which can include a zero wind condition (e.g., less than 0.01 kph, etc.) or even a sudden gust of wind in an opposite direction.

As an example, a system can provide for a selected combination of monitoring, data logging and programmable automated equipment control. As an example, a system can incorporate such features into a deployable framework to ensure rapid reaction times and to reduce risks of human error associated with flaring operations.

As an example, a system may be deployable as a combination of hardware and software that can include site-based hardware and optionally remote hardware (e.g., circuitry, processors, memory, etc.). Such a system may be deployed to retrofit one or more existing well testing packages, optionally with minimal modifications to the core process equipment.

As an example, a system can consider exit velocity of fluid, for example, gas to be combusted, as a factor in determining when and/or how to perform flaring. In such an example, wind conditions may be characterized. For example, consider classifications such as no wind, low wind (e.g., less than 3 knots), and opposing wind (e.g., of at least 2 knots).

As to gas exit velocity, consider a system that can implement one or more separation technologies that can effectively help to increase gas exit velocity. For example, fluid can include some amount of liquid such as water in addition to gas. In such an example, one or more separation technologies can provide for liquid-gas separation. In various scenarios, as the presence of liquid can slow the effective gas velocity, removal of liquid can increase the gas velocity. As an example, a system may act to increase gas velocity responsive to detection of a low fluid flow rate where the system can do so by implementing one or more two phase separators. In such an example, the system may also implement a smaller diameter gas line and/or flare tip. For example, consider a system that can automatically select one or more of a separator, a gas line and a flare tip to increase gas exit velocity to thereby improve dispersion of combustion constituents. As explained, such a system can perform such automatic selecting responsive to one or more environmental conditions, whether such one or more environmental conditions are sensed, predicted (forecast), etc., and/or responsive to one or more flow conditions (e.g., detection of a reduced flow rate of gas, detection of presence of liquid, detection of an increase in liquid, etc.).

As an example, a system can include operational instructions that can be tailored to a particular site, with respect to its environment and equipment. For example, consider a control scheme that can include the following criteria and control actions:

0-8 MMscfd|2000 BPD: perform two phase separation and select the 4-inch gas line;
  9-20 MMscfd|1500 BPD: no separation and select the 4-inch gas line; and
  21-120 MMscfd|4500 BPD: no separation and select the 8-inch gas line.

In the foregoing examples, a flare tip may be oriented at a particular angle. For example, consider an angle of approximately 45 degrees. As an example, a choke or chokes may be utilized, which can be automatically controllable (e.g., an automated choke or automated chokes). As an example, a system may provide for control of flow such that upon a change from one flow range to another flow range, the system may automatically control one or more aspects of operations (e.g., separation, flow line, boom orientation, etc.).

Referring again to FIG. 2, the system 250 includes two burners 276-1 and 276-2. As shown, each of the burners 276-1 and 276-2 includes a boom where a boom may be fixed or rotatable. As an example, the burners 276-1 and 276-2 can include respective booms that may be oriented in substantially opposite directions such that one may be suitable for a first range of wind directions and the other one may be suitable for a second range of wind directions. In such an example, the gas manifold 274 may be selectively controlled to direct fluid to the burner 276-1 and/or to the burner 276-2 responsive to one or more control criteria, which can include wind direction. In general, a boom may be selected and/or oriented such that it is downwind of a site to thereby help reduce dispersion of combustion constituents toward the site (e.g., where operational personnel may be present).

As an example, a system can include a control scheme that includes the following criteria and control actions:

5 MMscfd to 120 MMscfd: 2-minute window to switch booms with 2 knot opposing wind; and <5 MMscfd: <1-minute window to switch booms with 2 knot opposing wind, EESD activation<5 sec.

As an example, a system can account for gas velocity and dispersion while performing safety monitoring to automate equipment control to mitigate flaring risks.

As an example, a system can include one or more of the following: anemometers (wind monitors) for continuous logging of speed and direction; gas detectors (SOx, H2S, CH4, NOx) for alerts in case of gas blow back; a dual leg multiphase meter to allow for metering flow range coverage; flame and smoke cameras for monitoring of combustion efficiency; and infrared/thermal monitors for monitoring of rig structures surface temperatures. As an example, a system can include one or more of the following: electrical ESD for quick reaction with logic input; an actuated gas manifold for automated and quick switching of booms; and an actuated choke for automated flow and pressure control. As explained, various types of equipment may be included and controlled, which may provide for separations, adjusting boom direction, adjusting flow line sizes (e.g., diameter), adjusting flare tip configuration, etc.

As to combustion constituents, SO2 can be generated from the combustion of H2S, which can be present in well gas. For example, so-called sour natural gas includes measurable amounts of H2S above 4 ppmv. Sour natural gas can cause corrosion and stress corrosion cracking (SCC), particularly in pipelines. With the advent of corrosion resistant materials and advanced manufacturing techniques for steel pipelines the production of sour gas reserves has become possible where downstream refineries can handle sour gas as a by-product from the processing of sour crude oil. However, H2S is highly toxic and can cause serious injury and death at relatively low concentrations. The characteristic odor can be detected by human beings at very low concentrations; yet, at higher concentrations the odor can no longer be detected by human beings and the inability of human beings to detect its presence is a major risk factor. H2S levels have been defined by the American Conference of Industrial Hygienists (ACGIH) as follows: 1 ppm, unpleasant odor, possible eye irritation, ACGIH recommended Threshold Limit Value Time Weighted Average (TLV-TWA) over 8 hours; and 5 ppm, ACGIH Threshold Limit Value Short Term Exposure Level (TLV-STEL) averaged over 15 minutes. As an example, a system can utilize one or more ACGIH and/or other health criteria for purposes of controlling flaring. While SO2 is mentioned, one or more other constituents may be utilized for purposes of control (e.g., NOx, etc.).

Figure 7:
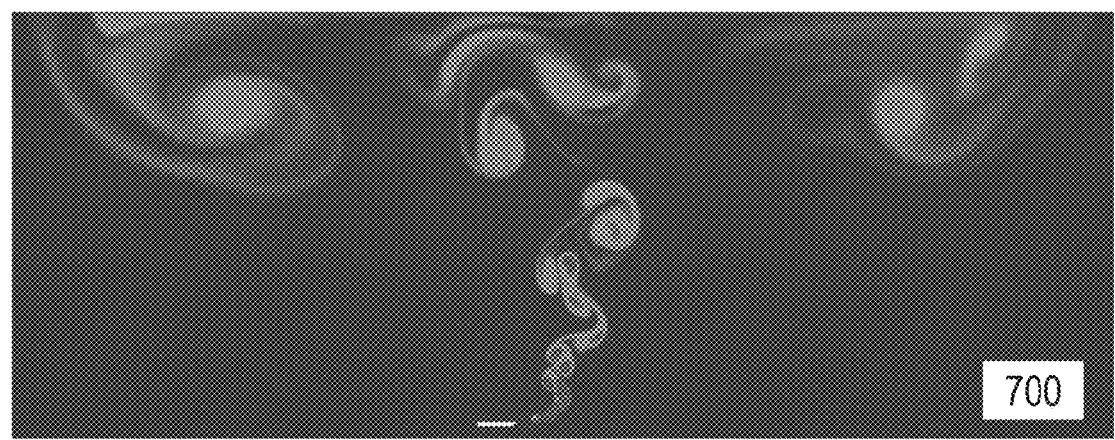
FIG. 7 is a series of example plots of computational fluid dynamics simulation results.
Figure 7:
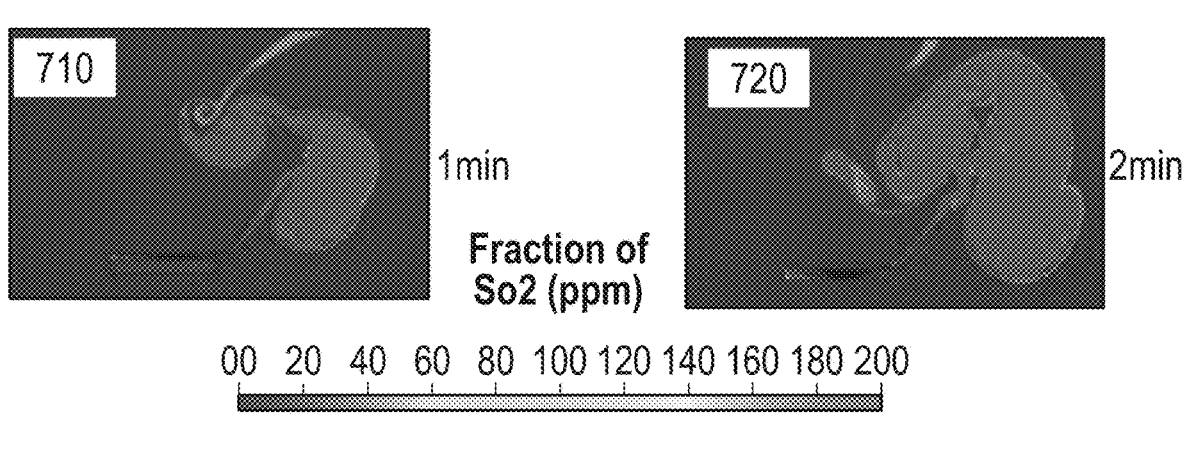
Figure 7:
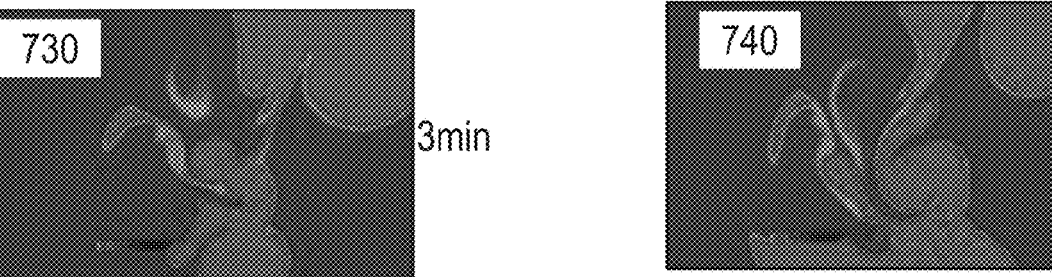

FIG. 7 shows examples of computational fluid dynamics (CFD) results plots 700, 710, 720, 730 and 740 from a CFD simulation that can be utilized for determining optimal flare tip size and orientation for purposes of effective dispersion of SO2 gas in the atmosphere around a rig.

The CFD results show an example of a burner with a flare tip. The CFD results are generated using the ANSYS framework FLUENT CFD package (Canonsburg, PA). CFD analysis can account for various environmental conditions, which can include wind, temperature, radiation, buoyancy, diffusion, etc. For example, a CFD analysis can account for various types of transport phenomena. The CFD result 700 provides for assessing concentrations of various combustion constituents in relationship to a site. For example, as shown, flaring can be performed for given environmental conditions where combustion constituents are dispersed such that risk at a site is suitably low.

As an example, a system can control flaring, which can include switching off and on flaring in a relatively rapid manner (e.g., seconds, less than a minute, etc.). As explained, a system can be tailored using CFD results. For example, consider the plots 710, 720, 730 and 740, which indicate fraction of SO2 ppm for a period of four minutes. As shown, environmental conditions can cause various types of flows of combustion constituents.

As explained, a system may aim to reduce risks at a site as to exposure of various constituents. As an example, a system may aim to control equipment at a site to move as rapidly as possible from a higher risk zone to a lower risk zone of operation. For example, as flow of gas increases, risk can decrease. As explained, a high-risk zone may demand use of separation to remove liquid from a fluid such that gas velocity can be increased, which can aid in dispersion of combustion constituents to thereby reduce risk. In various examples, a system may aim to optimize combustion such that combustion is more efficient, which may aid in thermal and/or other effects beneficial to dispersion.

As an example, a system may provide for control during a start-up period for well testing given particular environmental conditions. In such an example, flow may start from a flow rate of zero where fluid can include liquid such as water and then be ramped up where separation can be used to remove at least some of the liquid to increase flow rate of gas. Once the flow rate of gas is above a particular level, flaring may be more immune to environmental conditions as the flow rate can be sufficient to ensure a gas velocity adequate for dispersion of combustion constituents. In various scenarios, an operation may have to wait until environmental conditions are suitable for a start-up period. As explained, a system can make start-up periods possible under environmental conditions that would otherwise be, conventionally, not suitable for starting up an operation. As such, a system can make operation start-up practical over a wider range of environmental conditions.

Figure 8:
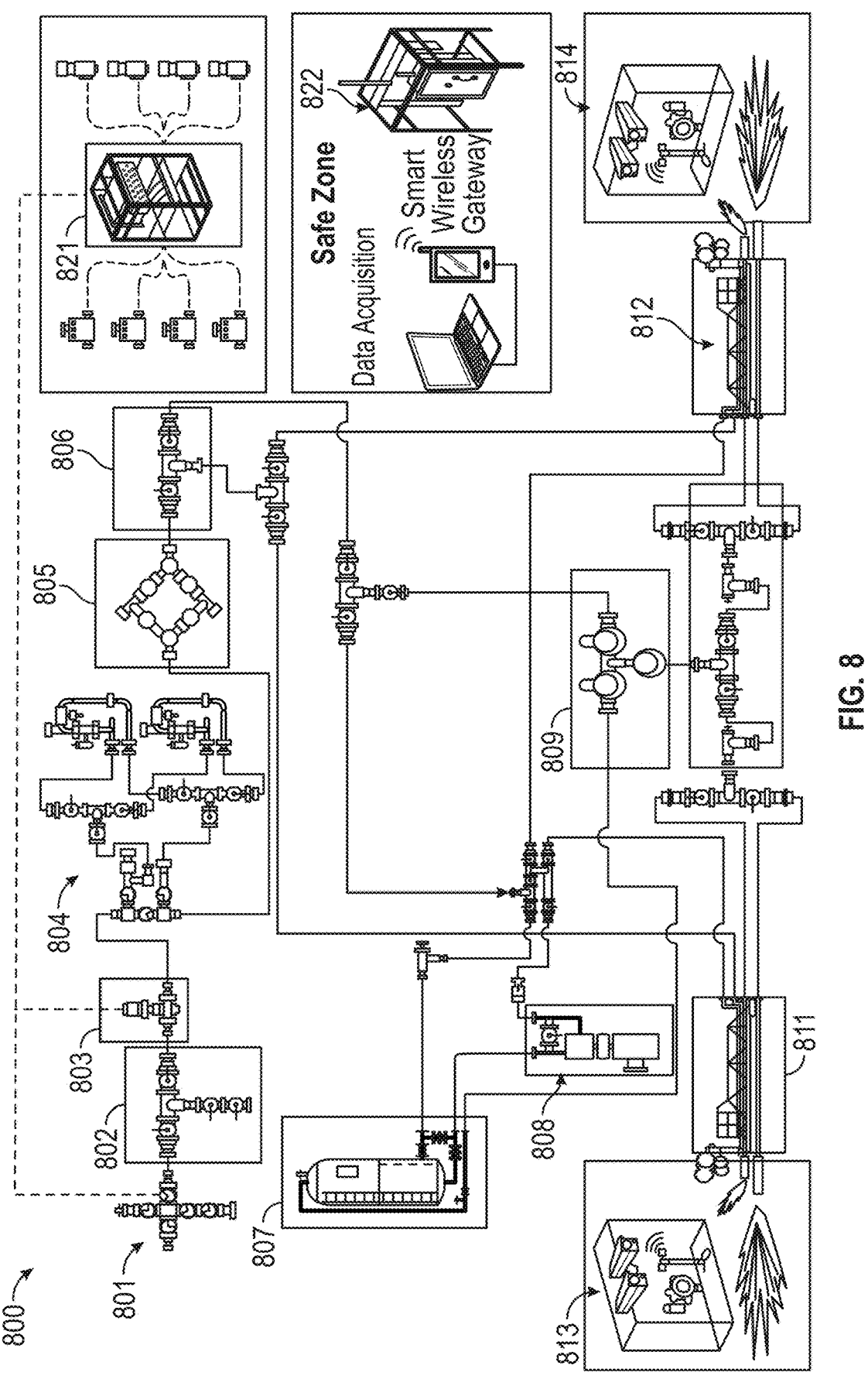
FIG. 8 is a diagram of an example of a system.

FIG. 8 shows an example of a process flow diagram 800 that provides an overview of equipment that can be used for performing various operations. For example, consider well cleanup operations and supplemental equipment highlighted in blue which can be utilized for optimizing flaring operations in unfavorable wind conditions.

In the example of FIG. 8, 801 is a flowhead, 802 is a diverter, 803 is a surface safety valve, 804 is a set of diverters, 805 is a choke manifold, 806 is a diverter, 807 is a vertical surge tank, 808 is a transfer pump and 809 is a diverter. Two burners are shown as being provided at the end of two burner booms 811, 812 and oriented in different directions. Each burner is monitored by a camera and wind monitoring system 813, 814. 821 is an electrical emergency shutdown module provided in the well test area and 822 is an electrical emergency shutdown module provided in the non-hazardous area also known as safe zone. The process flow diagram 800 can also include one or more of the features as shown in the example system 250 of FIG. 2. As explained, one or more separators, valves, manifolds, sensors, actuators, etc., can be included.

As to types of machine learning models that may be utilized by a system, consider one or more of a support vector machine (SVM) model, a k-nearest neighbors (KNN) model, an ensemble classifier model, a neural network (NN) model, etc. As an example, a machine learning model can be a deep learning model (e.g., deep Boltzmann machine, deep belief network, convolutional neural network, stacked autoencoder, etc.), an ensemble model (e.g., random forest, gradient boosting machine, bootstrapped aggregation, Ada-Boost, stacked generalization, gradient boosted regression tree, etc.), a neural network model (e.g., radial basis function network, perceptron, back-propagation, Hopfield network, etc.), a regularization model (e.g., ridge regression, least absolute shrinkage and selection operator, elastic net, least angle regression), a rule system model (e.g., cubist, one rule, zero rule, repeated incremental pruning to produce error reduction), a regression model (e.g., linear regression, ordinary least squares regression, stepwise regression, multivariate adaptive regression splines, locally estimated scatterplot smoothing, logistic regression, etc.), a Bayesian model (e.g., naïve Bayes, average one-dependence estimators, Bayesian belief network, Gaussian naïve Bayes, multinomial naïve Bayes, Bayesian network), a decision tree model (e.g., classification and regression tree, iterative dichotomiser 3, C4.5, C5.0, chi-squared automatic interaction detection, decision stump, conditional decision tree, M5), a dimensionality reduction model (e.g., principal component analysis, partial least squares regression, Sammon mapping, multidimensional scaling, projection pursuit, principal component regression, partial least squares discriminant analysis, mixture discriminant analysis, quadratic discriminant analysis, regularized discriminant analysis, flexible discriminant analysis, linear discriminant analysis, etc.), an instance model (e.g., k-nearest neighbor, learning vector quantization, self-organizing map, locally weighted learning, etc.), a clustering model (e.g., k-means, k-medians, expectation maximization, hierarchical clustering, etc.), etc.

As an example, the TENSORFLOW framework (Google LLC, Mountain View, California) may be implemented, which is an open source software library for dataflow programming that includes a symbolic math library, which can be implemented for machine learning applications that can include neural networks. As an example, the CAFFE framework may be implemented, which is a DL framework developed by Berkeley AI Research (BAIR) (University of California, Berkeley, California). As another example, consider the SCIKIT platform (e.g., scikit-learn), which utilizes the PYTHON programming language. As an example, a framework such as the APOLLO AI framework may be utilized (APOLLO.AI GmbH, Germany). As mentioned, a framework such as the PYTORCH framework may be utilized.

As an example, a training method can include various actions that can operate on a dataset to train a ML model. As an example, a dataset can be split into training data and test data where test data can provide for evaluation. A method can include cross-validation of parameters and best parameters, which can be provided for model training.

The TENSORFLOW framework can run on multiple CPUs and GPUs (with optional CUDA (NVIDIA Corp., Santa Clara, California) and SYCL (The Khronos Group Inc., Beaverton, Oregon) extensions for general-purpose computing on graphics processing units (GPUs)). TENSORFLOW is available on 64-bit LINUX, MACOS (Apple Inc., Cupertino, California), WINDOWS (Microsoft Corp., Redmond, Washington), and mobile computing platforms including ANDROID (Google LLC, Mountain View, California) and IOS (Apple Inc.) operating system based platforms.

TENSORFLOW computations can be expressed as stateful dataflow graphs; noting that the name TENSORFLOW derives from the operations that such neural networks perform on multidimensional data arrays. Such arrays can be referred to as "tensors".

As an example, a device may utilize TENSORFLOW LITE (TFL) or another type of lightweight framework. TFL is a set of tools that enables on-device machine learning where models may run on mobile, embedded, and IoT devices. TFL is optimized for on-device machine learning, by addressing latency (no round-trip to a server), privacy (no personal data leaves the device), connectivity (Internet connectivity is demanded), size (reduced model and binary size) and power consumption (e.g., efficient inference and a lack of network connections). TFL includes multiple platform support, covering ANDROID and iOS devices, embedded LINUX, and microcontrollers along with diverse language support, which includes JAVA, SWIFT, Objective-C, C++, and PYTHON. TFL can provide high performance, with hardware acceleration and model optimization. Machine learning tasks that may be performed using TFL may include, for example, simulation, regression, classification, object detection, pose estimation, question answering, text classification, etc. As an example, a gateway may be installed at a site and provide for execution of a framework such as, for example, the TFL framework. In such an example, the gateway may provide for determining one or more control actions and issuance of one or more control actions, for example, to control flaring operations at the site.

Figure 9:
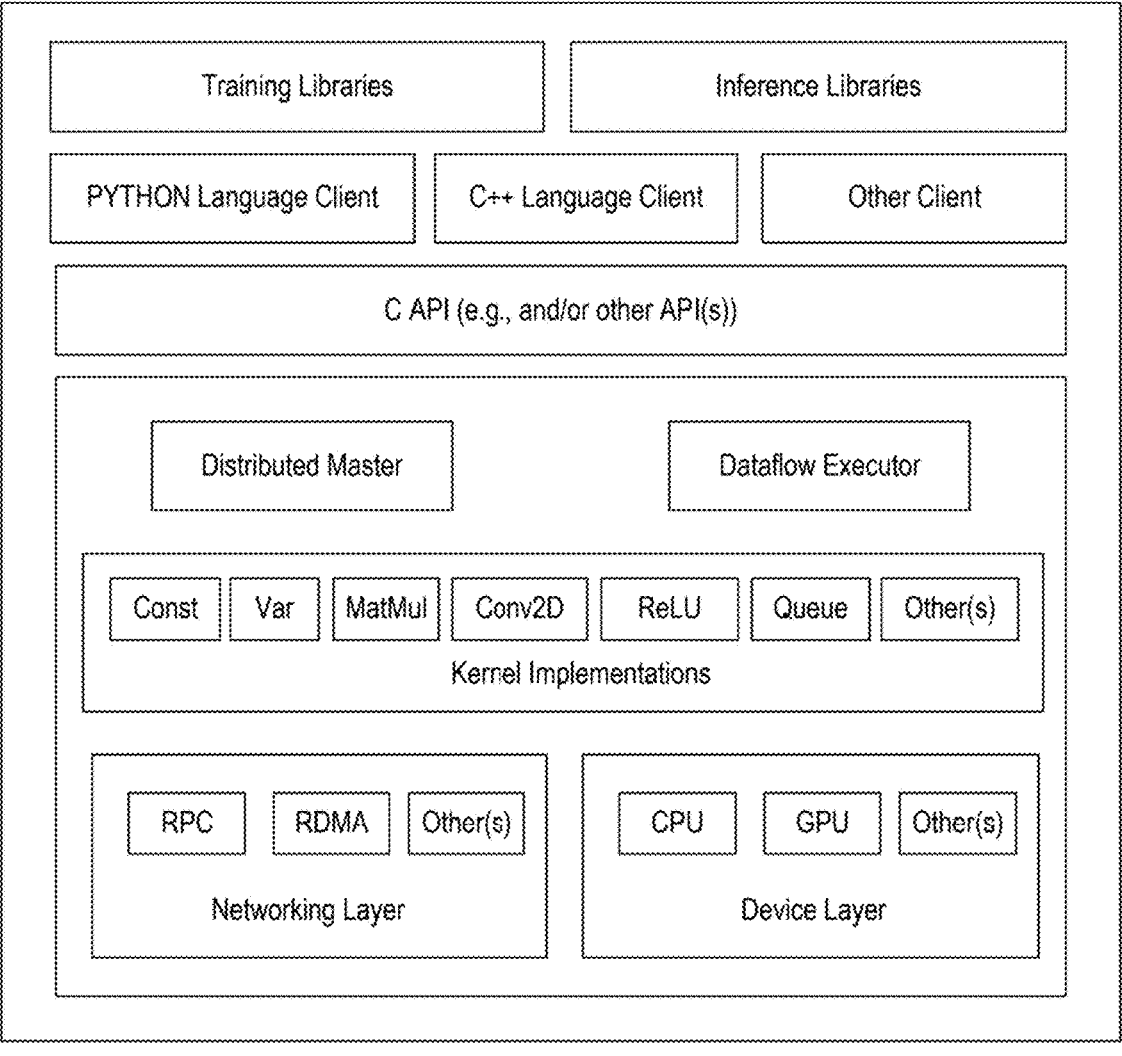
FIG. 9 is a diagram of an example of a computational framework.
Figure 9:
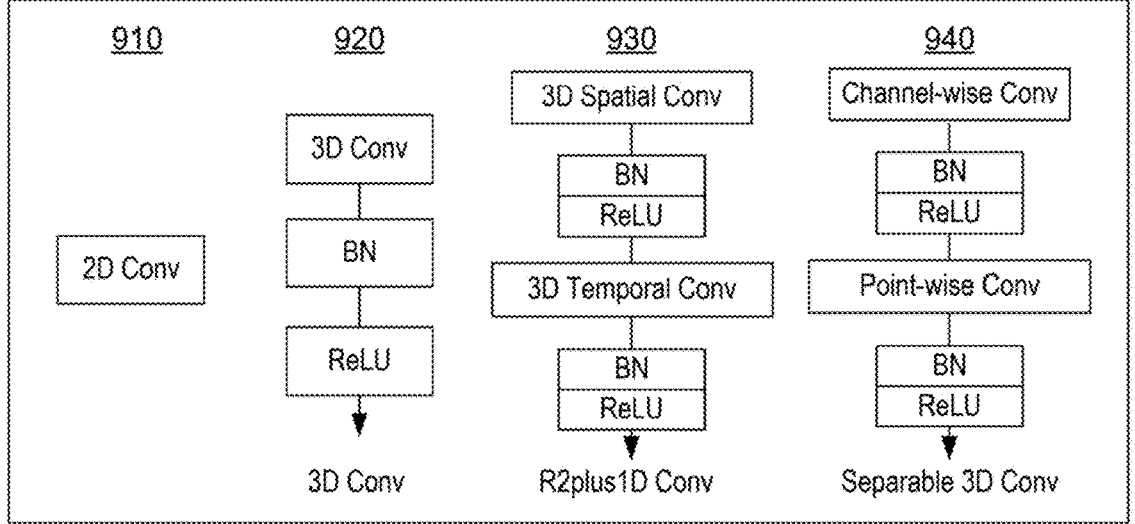

FIG. 9 shows an architecture 900 of a framework such as the TENSORFLOW framework. As shown, the architecture 900 includes various features. As an example, in the terminology of the architecture 900, a client can define a computation as a dataflow graph and, for example, can initiate graph execution using a session. As an example, a distributed master can prune a specific subgraph from the graph, as defined by the arguments to "Session.run( )"; partition the subgraph into multiple pieces that run in different processes and devices; distributes the graph pieces to worker services; and initiate graph piece execution by worker services. As to worker services (e.g., one per task), as an example, they may schedule the execution of graph operations using kernel implementations appropriate to hardware available (CPUs, GPUs, etc.) and, for example, send and receive operation results to and from other worker services. As to kernel implementations, these may, for example, perform computations for individual graph operations.

FIG. 9 also shows some examples of types of machine learning models 910, 920, 930, and 940, one or more of which may be utilized. As explained, a ML model-based approach can include receiving image data that can be spatial image data. As an example, time can be a dimension such that image data can be spatial and temporal. As an example, a convolution neural network and/or one or more other types of neural networks can be utilized for spatial and/or spatial-temporal image analysis.

As an example, a system may monitor, analyze, control, etc., one or more operations in a basin region such as, for example, an onshore and/or an offshore region. For example, consider the Permian Basin, where gas production can exceed pipeline capacity exiting the Permian Basin region, which may result in increased flaring. The Permian Basin is predominantly a shale oil play and has large quantities of associated gas production. Permian crude and natural gas liquids (NGL) production are expected to grow from 3.3 MMb/d in 2017 to 8.8 MMb/d by 2025, which in turn is expected to cause natural gas production to rise from 7.1 to 16.0 bcfd over the same time frame. As an example, a system may be utilized for on-shore and/or off-shore sites.

Figure 10:
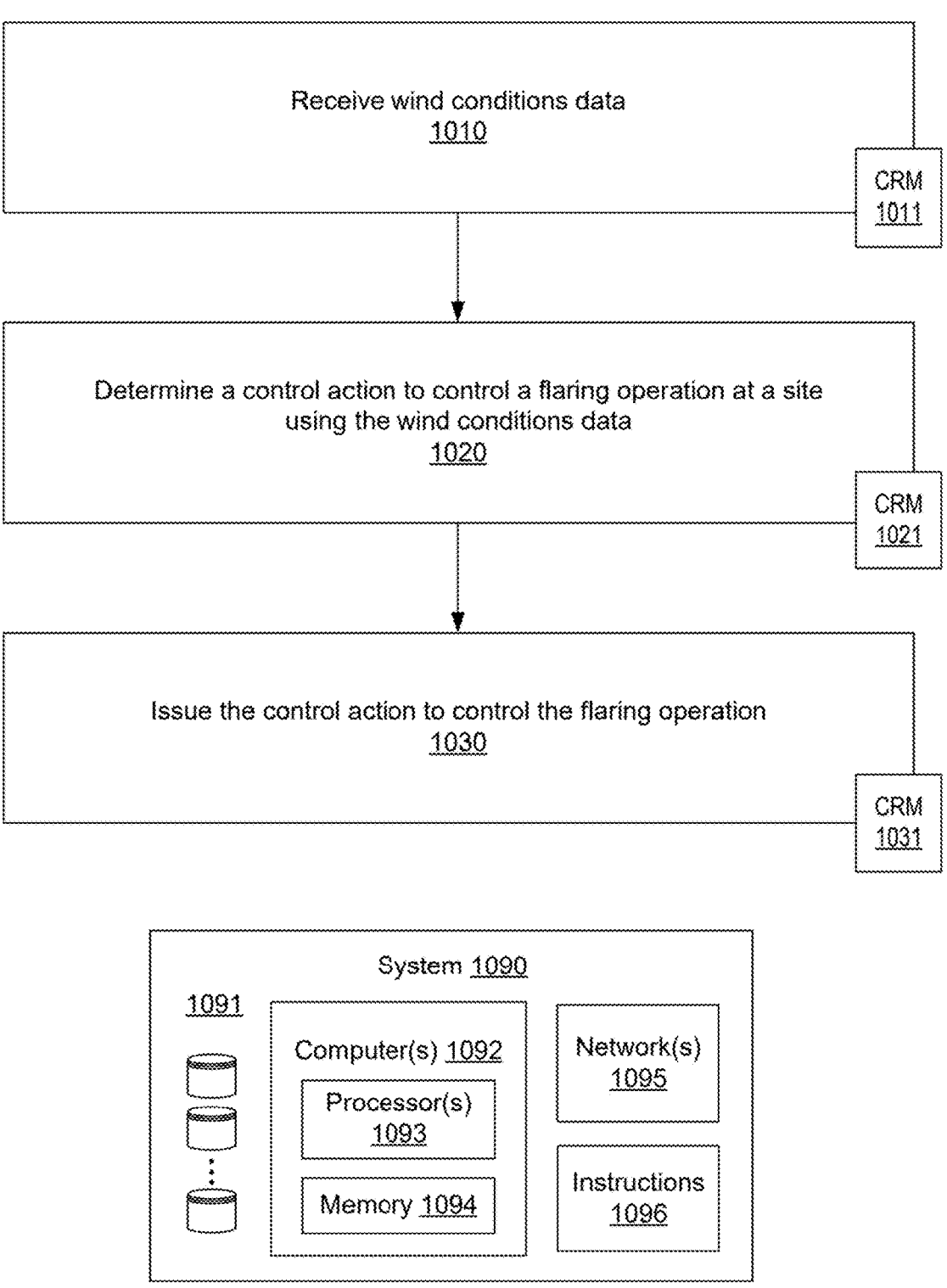
FIG. 10 is a diagram of an example of a method and an example of a system.

FIG. 10 shows an example of a method 1000 and an example of a system 1090. As shown, the method 1000 includes a reception block 1010 for receiving wind conditions data; a determination block 1020 for determining a control action to control a flaring operation at a site using the wind conditions data; and an issuance block 1030 for issuing the control action to control the flaring operation.

The method 1000 is shown as including various computer-readable storage medium (CRM) blocks 1011, 1021, and 1031 that can include processor-executable instructions that can instruct a computing system, which can be a control system, to perform one or more of the actions described with respect to the method 1000.

In the example of FIG. 10, the system 1090 includes one or more information storage devices 1091, one or more computers 1092, one or more networks 1095 and instructions 1096. As to the one or more computers 1092, each computer may include one or more processors (e.g., or processing cores) 1093 and a memory 1094 for storing the instructions 1096, for example, executable by at least one of the one or more processors 1093 (see, e.g., the blocks 1011, 1021 and 1031). As an example, a computer may include one or more network interfaces (e.g., wired or wireless), one or more graphics cards, a display interface (e.g., wired or wireless), etc.

As an example, the method 1000 may be a workflow that can be implemented using one or more frameworks that may be within a framework environment. As an example, the system 1090 can include local and/or remote resources. For example, consider a browser application executing on a client device as being a local resource with respect to a user of the browser application and a cloud-based computing device as being a remote resource with respect to the user. In such an example, the user may interact with the client device via the browser application where information is transmitted to the cloud-based computing device (or devices) and where information may be received in response and rendered to a display operatively coupled to the client device (e.g., via services, APIs, etc.).

As an example, a method can include receiving wind conditions data; determining a control action to control a flaring operation at a site using the wind conditions data; and issuing the control action to control the flaring operation. In such an example, the wind conditions data can include wind conditions data for the site.

As an example, a method can include determining a control action to control a flaring operation at a site by at least in part performing a computational fluid dynamics simulation. As an example, a method can include determining a control action by at least in part using a trained machine learning model. For example, consider a trained machine learning model that is trained using wind conditions data and/or using computational fluid dynamics simulation results.

As an example, a control action can provide for control of one or more of multiple flare tip size and flare tip angle. In such an example, the control action can facilitate dispersion of gas such that a level or levels of particular material or materials are acceptable at a site (e.g., for equipment, humans, etc.).

As an example, a control action can provide for control of a burner boom. For example, consider selection of a particular burner boom, orientation of a burner boom, etc.

As an example, a control action can provide for control of fluid flow via one or more of multiple fluid lines. In such an example, such control may be rate based, volume based, type of fluid based, etc.

As an example, a control action can provide for control of fluid flow to one or more of different fluid lines, where the different fluid lines have different cross-sectional areas. For example, for a low fluid flow condition, a control action can control fluid flow to flow to a smaller cross-sectional area fluid line. In such an example, the velocity of the fluid flow can be increased when compared to a fluid line with a larger cross-sectional area. As explained, a higher fluid flow velocity in a fluid line can improve dispersion at a flare tip, noting that combustion and/or one or more other aspects of flaring may be improved.

As an example, a control action can provide for control of fluid flow to one or more separators. For example, consider a scenario where at least one of the one or more separators separates liquid from the fluid flow to increase flow of gas.

As an example, a method can include training a trained machine learning to determine a control action responsive to input. For example, consider a scenario where the input includes at least a portion of wind conditions data. As explained, wind conditions (e.g., environmental conditions) can affect dispersion of constituents from a flare tip of a flaring operation. As explained, a method can provide for adjusting a flaring operation such that flaring may be possible with reduced risk of unacceptable levels of constituents at a site where, otherwise, flaring may have been prohibited resulting in downtime (e.g., non-productive time). As an example, a method may exercise a fine level of control over flaring such that flaring may be terminated and restarted as appropriate, which may be performed in an effort to ramp up flaring to a regime where flow is sufficient to maintain flaring in an acceptable manner. As explained, control may call for changing a flow line (e.g., with respect to cross-sectional area), call for separating liquid (e.g., water), call for adjusting or selecting a flare tip, etc. Such control actions may aim to effectively increase a velocity of gas and flared constituents (e.g., combustion products, etc.).

As an example, a method can include evaluating a control action prior to issuing the control action. For example, consider a method that includes evaluating by at least in part performing a computational fluid dynamics simulation and/or evaluating by at least in part testing the control action using a trained machine learning model. In such an example, an avatar or digital twin may be involved in the testing. For example, consider a virtual system for flaring that can account for various environmental conditions such that a control action can be implemented using the virtual system to determine a result under one or more sets of environmental conditions, which may correspond to past, current, future, etc., environmental conditions as a site or sites.

As an example, a method may account for multiple sites where the multiple sites are in proximity to one another. In such an example, the method may determine whether environmental conditions (e.g., wind conditions, temperature, etc.) may give rise to a risk of downstream accumulation, concentrations, etc., that may elevate levels of constituents at a site or sites. For example, given an upwind site and a downwind site, control may be performed in a manner where the downwind site does not experience unacceptable levels from the upwind site or a combination of the upwind site and the downwind site. Control may include operating one of the sites, which may be the upwind site or the downwind site, depending on how dispersion of constituents occurs, which can depend on conditions at each of the sites. In terms of non-productive time (NPT), a method may perform an NPT analysis to determine which site or sites to operate when a choice is to be made as to non-operation of a site or sites. For example, if a choice is between operation of an upwind site or a downwind site, the site that may be most impacted by NPT may be selected as the site to be operated.

As an example, a system can include a flaring optimization computational framework that generates control actions responsive to wind conditions data; and a flaring control unit controllable by the control actions. In such an example, the system may provide for control of flaring at one or more sites. As an example, a system may be implemented at a site using, for example, a gateway device that can receive information pertaining to local conditions (e.g., wind, temperature, etc.), local operational information (e.g., production rates, gas fraction, water fraction, etc.) and generate one or more control actions to control flaring at the site where the system can aim to achieve acceptable levels of one or more constituents at the site (e.g., SOx, NOx, etc.).

As an example, one or more computer-readable storage media can include processor-executable instructions to instruct a computing system to: receive wind conditions data; determine a control action to control a flaring operation at a site using the wind conditions data; and issue the control action to control the flaring operation.

A computer-readable storage medium (or computer-readable storage media) is non-transitory, not a signal and not a carrier wave. Rather, a computer-readable storage medium is a physical device that can be considered to be circuitry or hardware.

Figure 11:
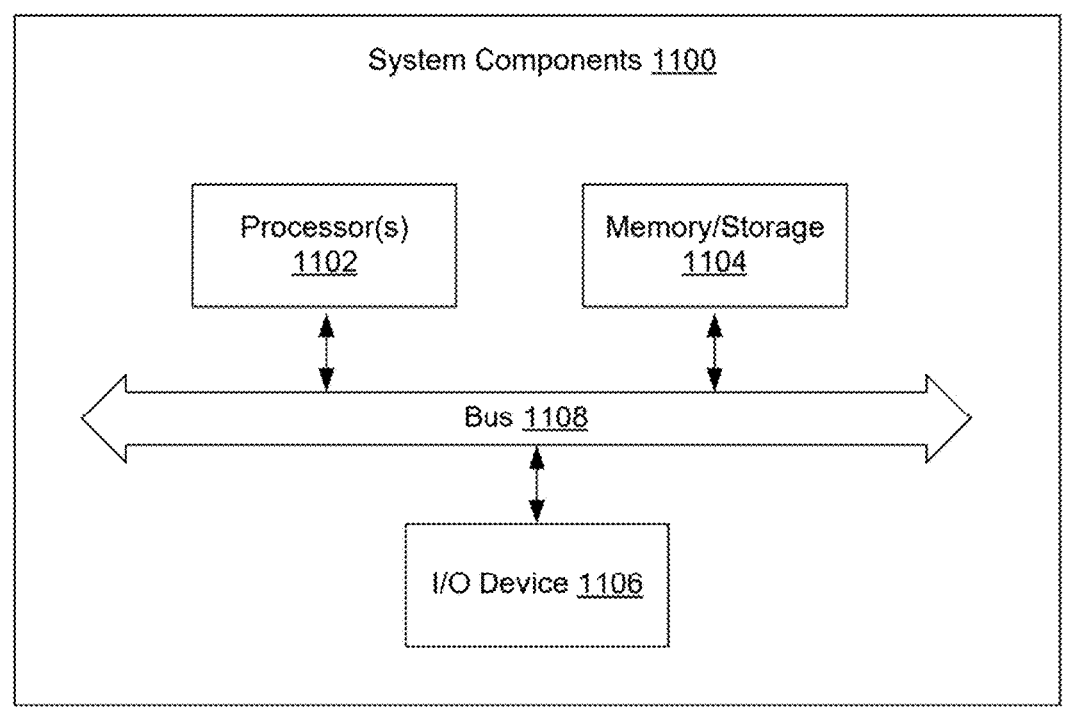
FIG. 11 illustrates example components of a system and a networked system.
Figure 11:
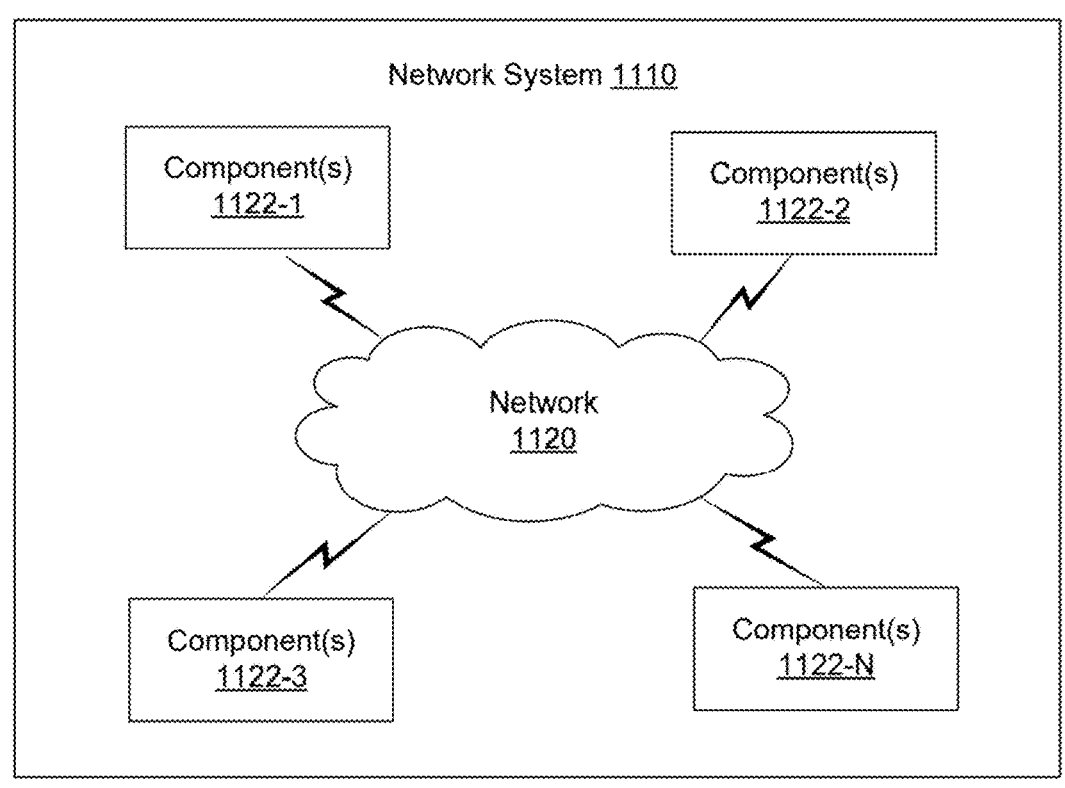

FIG. 11 shows components of an example of a computing system 1100 and an example of a networked system 1110 with a network 1120. The system 1100 includes one or more processors 1102, memory and/or storage components 1104, one or more input and/or output devices 1106 and a bus 1108. In an example embodiment, instructions may be stored in one or more computer-readable media (e.g., memory/ storage components 1104). Such instructions may be read by one or more processors (e.g., the processor(s) 1102) via a communication bus (e.g., the bus 1108), which may be wired or wireless. The one or more processors may execute such instructions to implement (wholly or in part) one or more attributes (e.g., as part of a method). A user may view output from and interact with a process via an I/O device (e.g., the device 1106). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1110. The network system 1110 includes components 1122-1, 1122-2, 1122-3, . . . 1122-N. For example, the components 1122-1 may include the processor(s) 1102 while the component(s) 1122-3 may include memory accessible by the processor(s) 1102. Further, the component(s) 1122-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:
1. A method comprising:
receiving wind conditions data;

determining a control action to control a flaring operation at a site using the wind conditions data, wherein the determining the control action comprises:

performing a computational fluid dynamics (CFD) simulation of the flaring operation using the wind conditions data;

determining one or more respective concentrations of one or more combustion constituents relative to the site based on the CFD simulation;

determining an optimal flare tip size and orientation based on the one or more respective concentrations of the one or more combustion constituents; and identifying the control action based on the optimal flare tip size and orientation; and issuing the control action to control the flaring operation.

2. The method of claim 1, wherein the wind conditions data comprises wind conditions data for the site.

3. The method of claim 1, wherein the control action controls the optimal flare tip size and orientation.

4. The method of claim 1, wherein the control action controls a burner boom.

5. The method of claim 1, wherein the control action controls fluid flow via one or more of multiple fluid lines.

6. The method of claim 1, wherein the control action controls fluid flow to one or more of different fluid lines, wherein the different fluid lines comprise different cross-sectional areas.

7. The method of claim 6, wherein, for a low fluid flow condition, the control action controls the fluid flow to flow to a smaller cross-sectional area fluid line.

8. The method of claim 1, wherein the control action controls fluid flow to one or more separators.

9. The method of claim 8, wherein at least one of the one or more separators separates liquid from the fluid flow to increase flow of gas.

10. The method of claim 1, comprising evaluating the control action prior to the issuing.

11. The method of claim 10, wherein the evaluating comprises performing an additional CFD simulation.

12. The method of claim 1, wherein the one or more combustion constituents comprise sulfur dioxide, one or more nitrogen oxides, or any combination thereof.

13. A system comprising:

a flaring optimization computational framework comprising a processor and a memory that generates one or more control actions responsive to wind conditions data, wherein the flaring optimization computational framework is configured to:

receive the wind conditions data;

determine the one or more control actions to control a flaring operation at a site using the wind conditions data by:

performing a computational fluid dynamics (CFD) simulation of the flaring operation using the wind conditions data;

determining one or more respective concentrations of one or more combustion constituents relative to the site based on the CFD simulation;

determining an optimal flare tip size and orientation based on the one or more respective concentrations of the one or more combustion constituents; and identifying the one or more control actions based on the optimal flare tip size and orientation; and a flaring control unit controllable by the one or more control actions.

14. One or more computer-readable storage media comprising processor-executable instructions to instruct a computing system to:

receive wind conditions data;

determine a control action to control a flaring operation at a site using the wind conditions data, wherein the determining the control action comprises:

performing a computational fluid dynamics (CFD) simulation of the flaring operation using the wind conditions data;

determining one or more respective concentrations of one or more combustion constituents relative to the site based on the CFD simulation, wherein the one or more combustion constituents comprise sulfur dioxide, one or more nitrogen oxides, or any combination thereof;

determining an optimal flare tip size and orientation based on the one or more respective concentrations of the one or more combustion constituents; and identifying the control action based on the optimal flare tip size and orientation; and issue the control action to control the flaring operation.

15. The system of claim 13, wherein the one or more combustion constituents comprise sulfur dioxide, one or more nitrogen oxides, or any combination thereof.

* * * * *